United States Patent [19]

Freeman

[11] Patent Number: 5,594,698
[45] Date of Patent: Jan. 14, 1997

[54] RANDOM ACCESS MEMORY (RAM) BASED CONFIGURABLE ARRAYS

[75] Inventor: Richard D. Freeman, San Carlos, Calif.

[73] Assignee: Zycad Corporation, Fremont, Calif.

[21] Appl. No.: 334,885

[22] Filed: Nov. 4, 1994

Related U.S. Application Data

[63] Continuation of Ser. No. 32,610, Mar. 17, 1993, abandoned.

[51] Int. Cl.$^6$ .......................................................... G11C 7/00
[52] U.S. Cl. ............................................................... 365/222
[58] Field of Search ................................. 365/189.08, 222;
307/465; 326/44, 49

[56] References Cited

U.S. PATENT DOCUMENTS

| | | | |
|---|---|---|---|
| 3,750,115 | 7/1973 | Mundy | 365/49 |
| 3,760,361 | 9/1973 | Leger et al. | 340/825.88 |
| 4,091,359 | 5/1978 | Rossler | 340/825.87 |
| 4,103,182 | 7/1978 | Bradley | 364/716 X |
| 4,125,869 | 11/1978 | Gutmann | 364/716 X |
| 4,157,589 | 6/1979 | Kapral et al. | 364/716 |

(List continued on next page.)

FOREIGN PATENT DOCUMENTS

| | | |
|---|---|---|
| 0121647 | 11/1983 | European Pat. Off. . |
| 0122363 | 11/1983 | European Pat. Off. . |
| 52-36434 | 3/1977 | Japan . |
| 55-36928 | 3/1980 | Japan . |

(List continued on next page.)

OTHER PUBLICATIONS

"Reloadable Programmable Logic Array", T. Winlow, *IBM Technical Disclosure Bulletin*, vol. 24, No. 5, pp. 2424–2425, Oct., 1981.

"An Alterable Programmable Logic Array", J. F. Philippe Marchand, *IEEE Journal of Solid–State Circuits*, vol. SC–20, No. 5, pp. 1061–1066, Oct. 1985.

"A New CR–Delay Circuit Technology For High–Density and High–Speed DRAM's" Yohji Watanabe, Takashi Ohsawa, Kiyofumi Sakurai and Tohru Furuyama, *IEEE Journal of Solid–State Circuits*, vol. 24, No. 4, pp. 905–910, Aug., 1989.

"A 250K–Circuit ASIC Family Using a DRAM Technology", Weir, Kita, Cockerill, Hynek, Lepsic, Ta, Wong, Woodham & Young, *IEEE 1990 Custom Integrated Circuits Conference*, pp. 4.6.1–4.6.5 (1990).

"Programmable Array Serves As A Controller For Dynamic RAMs", T. Waugh, *EDN*, Feb. 18, 1988, pp. 169–174.

"High–Density Programmable Logic Takes on Gate Arrays", Dave Bursky, *Electronic Design*, Mar. 14, 1991, pp. 45–49 & 53, 56 & 57.

"FPGA Advances Cut Delays, Add Flexibility", Dave Bursky, *Electronic Design*, Technology Analysis, Oct. 1, 1992, pp. 35, 38, 40, 42 & 43.

"RAM–Based Logic Arrays Up Density, Cut Delays", Dave Bursky, *Electronic Design*, Oct. 1, 1992, pp. 45–49.

*Primary Examiner*—Joseph A. Popek
*Attorney, Agent, or Firm*—Townsend and Townsend and Crew LLP

[57] ABSTRACT

A field programmable device includes two separate and electrically isolated arrays of rows and columns of conductors sharing the same area of an integrated circuit substrate, one array interconnecting memory cells to form a random access memory ("RAM"). The other array forms a full or partial cross-point switching network that is controlled by information stored in memory cells, and/or connects to an operating electronic circuit that is configurable and operable in accordance with information stored in memory cells. In addition, the memory array is easily used to access desired nodes of the circuit array in order to be able to easily observe internal signals during operation. A preferred memory structure is a dynamic random access memory ("DRAM") because of a high density and low cost of existing DRAM fabrication techniques, even though periodic reading and refreshing of the states of the memory cells is required. Several circuits and techniques are used which allow continuous assertion of the memory cell states without interruption during the their refreshing cycles.

159 Claims, 11 Drawing Sheets

U.S. PATENT DOCUMENTS

| | | | |
|---|---|---|---|
| 4,207,556 | 6/1980 | Sugiyama et al. | 364/716 X |
| 4,293,783 | 10/1981 | Patil | 307/465 |
| 4,307,379 | 12/1981 | Wyland | 340/825.83 |
| 4,395,646 | 7/1983 | Cases et al. | 307/468 |
| 4,508,977 | 4/1985 | Page et al. | 307/468 |
| 4,524,430 | 6/1985 | Page | 365/189.08 |
| 4,541,067 | 9/1985 | Whitaker | 364/716 |
| 4,546,273 | 10/1985 | Osman | 307/468 |
| 4,551,814 | 11/1985 | Moore et al. | 364/716 |
| 4,551,815 | 11/1985 | Moore et al. | 364/716 |
| 4,604,727 | 8/1986 | Shah et al. | 365/189.08 |
| 4,622,648 | 11/1986 | Whitaker | 364/715 |
| 4,631,686 | 12/1986 | Ikawa et al. | 364/490 |
| 4,642,487 | 2/1987 | Carter | 307/465 |
| 4,727,268 | 2/1988 | Hori | 307/465 |
| 4,829,202 | 5/1989 | Austin | 307/465 |
| 4,847,612 | 7/1989 | Kaplinsky et al. | 340/825.8 |
| 4,855,619 | 8/1989 | Hsieh et al. | 307/443 |
| 4,857,774 | 8/1989 | El-Ayat et al. | 307/465 |
| 4,868,419 | 9/1989 | Austin | 307/444 |
| 4,870,302 | 9/1989 | Freeman | 307/465 |
| 4,876,466 | 10/1989 | Kondou et al. | 307/465 |
| 4,910,417 | 3/1990 | El Gamal et al. | 307/465 |
| 4,926,224 | 5/1990 | Redwine | 257/302 |
| 4,935,734 | 6/1990 | Austin | 340/825.83 |
| 5,001,368 | 3/1991 | Cliff et al. | 307/465 |
| 5,008,214 | 4/1991 | Redwine | 437/52 |
| 5,015,885 | 5/1991 | El Gamal et al. | 307/465 |
| 5,073,729 | 12/1991 | Greene et al. | 307/465.1 |
| 5,124,273 | 6/1992 | Minami | 437/51 |
| 5,132,570 | 7/1992 | Shutou et al. | 326/44 |
| 5,172,014 | 12/1992 | El Ayat et al. | 307/465 |
| 5,196,740 | 3/1993 | Austin | 307/465 X |

FOREIGN PATENT DOCUMENTS

| | | |
|---|---|---|
| 56-107571 | 8/1981 | Japan . |
| 56-111183 | 9/1981 | Japan . |
| 56-111185 | 9/1981 | Japan . |
| 57-123593 | 8/1982 | Japan . |
| 57-143789 | 9/1982 | Japan . |
| 58-202567 | 11/1983 | Japan . |
| 58-202565 | 11/1983 | Japan . |
| 58-220293 | 12/1983 | Japan . |
| 58-220292 | 12/1983 | Japan . |
| 59-70021 | 4/1984 | Japan . |
| 60-22892 | 2/1985 | Japan . |
| 61-63998 | 4/1986 | Japan . |
| 63-96799 | 4/1988 | Japan . |
| 63-160417 | 7/1988 | Japan . |
| 63-160416 | 7/1988 | Japan . |
| 2-98892 | 4/1990 | Japan . |
| 2-65295 | 5/1990 | Japan . |
| 2-278765 | 11/1990 | Japan . |
| 2-278764 | 11/1990 | Japan . |
| 2-278763 | 11/1990 | Japan . |
| 2-291723 | 12/1990 | Japan . |
| 2-291722 | 12/1990 | Japan . |
| 2-291720 | 12/1990 | Japan . |
| 3-59877 | 3/1991 | Japan . |
| 3-52189 | 3/1991 | Japan . |
| 4-74380 | 3/1992 | Japan . |
| 4-168691 | 6/1992 | Japan . |
| 4-301924 | 10/1992 | Japan . |
| 4-344387 | 11/1992 | Japan . |
| 4-356791 | 12/1992 | Japan . |
| 2-182220 | 5/1987 | United Kingdom . |

RANDOM ACCESS MEMORY (RAM) BASED CONFIGURABLE ARRAYS

This is a Continuation of application Ser. No. 08/032,610, filed Mar. 17, 1993, now abandoned.

BACKGROUND OF THE INVENTION

This invention relates generally to field programmable gate arrays ("FPGAs"). Field programmable gate or logic arrays usually store configuration data to control the FPGA's configurable switches and configurable logic blocks.

A problem with prior art FPGA chips is these chips' high cost per logic gate. Another problem is the lengthy period required for calculating the routing of these configurable logic chips. One prior art FPGA chip can take hours to route by computer. Yet another problem with prior art FPGA chips is their poor gate utilization. Because of the difficulties routing prior art FPGA chips, generally only a small fraction of the gates in a prior art FPGA chip are used for a given circuit design. Another problem with prior art FPGA chips is the poor visibility of the circuits placed in these chips. It is difficult to observe the value of certain nodes of the circuit placed on a prior art FPGA chips. It is also difficult to externally set the values of certain nodes of the circuit placed on the prior art FPGA chips. This lack of visibility is especially disadvantageous if the FPGA chips are used for emulation. It is desired to have observability and controllability of many locations in a circuit being emulated and tested.

It is therefore an object of the present invention to provide an FPGA chip which is cheaper in cost per gate.

A further object of the present invention is to provide an FPGA chip which requires less computer time to route.

A still further object of the present invention is to provide an FPGA chip with a high gate utilization. It is desired that a larger percentage of the gates in the FPGA chip be used for any given circuit design.

A yet another object of the present invention is to provide an FPGA chip with better visibility and controllability.

SUMMARY OF THE INVENTION

Some of the above objects of the present invention can be achieved by an integrated circuit chip that uses charge storage memory cells requiring a periodic refreshing of charge, such as dynamic random access memory ("DRAM") based memory cells, associated with the configurable switches and configuration bit buffers of the logic blocks. DRAM is a very dense type of memory. The small DRAM cells can be attached to the configurable switches used to interconnect conductors in the FPGAs and to buffers used to configure the logic blocks.

DRAM based memory cells have in the past been considered impractical for use in FPGA chips. DRAM memory cells use capacitors to store bits of data. These capacitors must be refreshed periodically so that the DRAM does not lose data. These DRAM cells are refreshed by reading the value from the capacitor and then rewriting this value back into the capacitor. The reading of the value of the capacitor in prior art DRAM systems temporarily destroys the value in the capacitor. For this reason, if the DRAM memory cell is attached to a switch or buffer in an FPGA chip, the state of the buffer or switch will likely change during the refreshing of the memory cell. Others have suggested, therefore, that it is necessary to include a separate memory of the contents of each cell of an array of charge storage cells in order to be able to periodically refresh their states without disrupting the elements that are set according to the memory cell states. However, the present invention is able to use DRAM type of cells in FPGAs in two possible manners without the necessity for such a duplicate memory.

According to one specific aspect of the present invention, limitations are placed upon the type of circuits that can be produced or emulated with the FPGAs. If the type of circuits emulated or placed on the FPGA only use flip-flops for storage elements, rather than using the combination logic to asynchronously store information, it is possible to use a traditional DRAM memory cell directly connected to switches and/or buffers in the FPGA. Even when limitations are placed on the emulated circuit, the FPGA must make sure that the system clock of the circuit emulated in the FPGA is not set within the period of time of the longest propagation delay of a signal going from one flip-flop storage element to another flip-flop storage element after the DRAM based memory cells are refreshed.

According to another and preferred specific aspect of the present invention, the traditional DRAM based memory cell portion of the switching cell is modified in one of several particular ways and directly coupled with a switching transistor or input of a buffer or inverter. This results in the switching cell maintaining, during its periodic refreshing, the state of the switches and configuration data buffers that are set according to that state.

One way to accomplish this result is to use a larger capacitor than normally used in a DRAM memory cell. By using this larger capacitor, the voltage at the switch or buffer can be maintained, during refresh, above or below the switching point of the driven switch or buffer. In addition, the writing time period of the refresh cycle of the DRAM based memory cell can be expanded to accommodate slower write back into the larger capacitor.

Alternatively, a resistive element can be added to the DRAM based memory cell having the same size capacitor as normally used. This resistive element can slow the discharge of the capacitor in the memory cell so that DRAM circuit can write back the value to the capacitor before the value in the capacitor reaches a switching point of the transistor. The resistor can also be combined with the use of a larger capacitor than normal.

Another embodiment of the present invention is to use two capacitors in the DRAM cell. These two capacitors are separated by a resistive element. The first capacitor which is closer to the access transistor of the memory cell can be read in a manner similar to a manner that a capacitor is read in the normal DRAM memory cell. The second capacitor, separated by the resistive element, is not read as quickly so that the switch or buffer connected to this second capacitor does not switch its state. The write time of the refresh cycle is increased so that both of these capacitors are charged up to the correct value in the write-back.

Furthermore, if the process is asymmetric, that is, if the writing of a logical "zero" or a logical "one" to the second capacitor takes more time, a leaky diode can be used to speed up either the writing of the logical "zero" or logical "one" into the second capacitor.

Additionally, multiple diodes can be used between two capacitors, one set of the diodes biased in one direction and the other set of diodes biased in the other direction. The use of these diodes can be used to prevent the pre-charging of the column from affecting the value at the second capacitor.

Of course, other changes can be made to the DRAM cell consistent with the present invention in order to maintain its state during a read and refresh operation.

The benefits of using a DRAM based memory cell include a lower cost per gate. DRAM chips are very cheap to produce so the benefit of using a modification of the DRAM cell is that it is likely that a DRAM based memory cell used in an FPGA chip will cause the FPGA chip of the present invention to be cheaper per gate than other prior art FPGA chips. Additionally, DRAM based memory is very dense. In present process techniques, the density of DRAM memory cells are limited by the metallization widths. The above discussed additional elements should not require a larger memory cell area. The access lines to the DRAM based memory cell units can be interspaced with interconnection lines also made of the metallization layers. Due to the increased density of the switches, a greater number of switches can be used in the FPGA chip of the present invention. This means that architectures that are derivative of full cross-point architectures can be used. These type of architectures use more switches for interconnection but are logically easier to interconnect. This means that the gate utilization of the FPGA will be increased and the computer time used to route the FPGA can be reduced. The reduction of the routing time is especially beneficial for emulation applications of the FPGA chips.

According to yet another aspect of the present invention, the random-access-memory ("RAM") is provided with the capability of accessing nodes of a configured switching network or logic circuit through the memory array for the purpose of monitoring signals at some nodes (visibility) and forcing signals at others (controllability). This benefit does not require the use of the dynamic type of RAM cells but a DRAM array is usually preferred because of its high density, low cost per bit, and other advantages discussed above. An example of nodes with which the observability feature can be used, for example, are inputs and outputs of selected logic blocks. An example of the use of the controllability feature is to set and reset flip-flops of a configured circuit. Use of the controllability and observability features allow for a high level of visibility and control that is particularly desirable when emulating an actual logic circuit or testing a particular circuit design that is configured on the chip. Because a circuit being emulated or tested is easily and rapidly reconfigurable, in total or in part, by randomly accessing and programming controlling memory locations (as opposed to existing systems requiring the loading of an entire serial bit stream in order to alter the configured circuit), the connections and logic functions of the configured circuit can easily and quickly be edited.

An additional benefit of the present invention concerns the use of the row and column decoder to set values in the emulation. The memory cells can be located right at the switch and buffer locations and the row and column lines of the decoder can be interleaved with the interconnection lines used for the switching between the logic gates.

BRIEF DESCRIPTION OF THE DRAWINGS

The above and other features and aspects of the present invention will become more apparent upon reading the following detailed description in conjunction with the accompanying drawings, in which:

FIG. 3B is a diagram of the circuit implemented by the layout of FIG. 3A;

DESCRIPTION OF THE PREFERRED EMBODIMENTS

Figure 1:
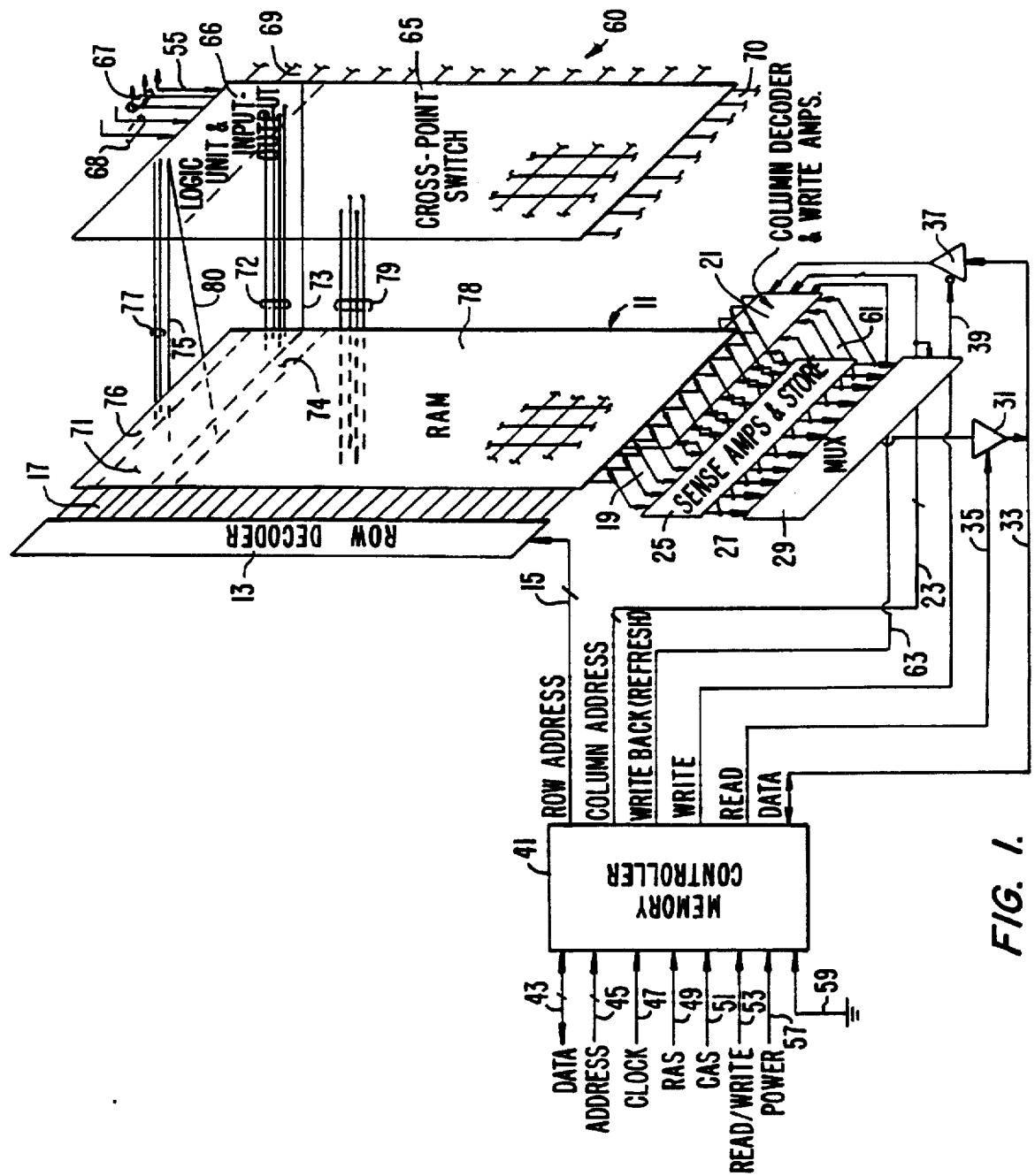
FIG. 1 shows the functional elements of a complete integrated circuit system that embodies various aspects of the present invention.

Although a system embodying the various aspects of the present invention can be implemented with two or more integrated circuit chips, either in separate packages or a single package, it is certainly preferable from a cost and utilization standpoint to do so on a single chip in its own package. The primary functional components of such a system implemented on a single chip are illustrated in FIG. 1. A RAM 11 follows a usual design of providing a two dimensional array of memory cells, one at each intersection of row and column conductors.

A row decoder 13, in response to a row address in a bus 15, selects a designated one of a plurality of row conductors 17 (word lines) to enable the reading from or writing to one or more of the memory cells connected to that row line. Reading from or writing to one or more of these memory cells at a time is accomplished by applying a proper voltage to those of a plurality of column lines 19 to which the desired cell(s) are also connected. For writing, a desired column or columns, to which the desired cell or cells are connected, are selected by a decoder 21 in response to an address on a column address bus 23. The column decoder block 21 also includes one or more write amplifiers for driving the selected addressed column line or lines. Similarly, sense amplifiers 25 are also connected to the column lines 19, usually a separate sense amplifier for each column line, the outputs of which are applied by lines 27 to a multiplexer 29 that selects one or more of the sense amplifier outputs in response to an address on the column address bus 23. The sense amplifiers 25 and multiplexer 29 allow reading any of the memory cells in a row whose row line 17 is properly energized and which are addressed by the multiplexer 29. An output of the multiplexer 29 is received by a gated amplifier 31 that provides an output in a data line 33 in response to a read control signal in a line 35. The individual sense amplifiers 25 are also designed to store, at least temporarily, the voltage level of their respective column lines. Another gated amplifier 37 receives a signal from the data line 33 and applies it to the column decoder and write amplifier block 21 in response to activation of a write signal in a line 39.

A memory controller 41 of a typical design is also included on the chip. The controller 41 connects the chip of FIG. 1 to other components in a larger system through package pins that include the following: a data bus 43, an address bus 45, a clock signal 47, a row address strobe ("RAS") signal 49, a column address strobe ("CAS") signal 51, a read/write control signal 53, and power pins 57 and 59.

A preferred form of the RAM 11 is the previously discussed DRAM because of the very high packing densities that are currently state of the art and its relatively low cost. Further, DRAM integrates nicely with an array 60 of conductors and configurable logic units which are selectively interconnected by field effect transistor ("FET") switches and configured, respectively, under control of the contents of memory cells within the memory array 11. Many aspects of the present invention can be implemented, however, with other forms of RAM, such as static RAM ("SRAM"), electrically erasable and programmable read only memory ("EEPROM"), or some other form of non-volatile memory. However, with the preferred choice of DRAM, the memory system must include the usual ability to periodically refresh the state of the memory cells. That is, since DRAM cells store either a 0 or 1 corresponding to a charge level stored on a capacitor within each cell, that charge leaks off over time. In the system of FIG. 1, conductors 61 apply the individual outputs of the read amplifiers 25, by connection to the individual lines 27, to inputs of the writing amplifiers within the block 21. In response to a refresh control signal in a line 63, the outputs of the read sense amplifiers, as temporarily stored therein, are applied back to the same column lines of the array 11 from which they were just read, through the writing amplifiers 21. Thus, an entire row of cells within the array 11 is refreshed at a single time. The refresh process, as is well known, first reads the states of cells within a designated row addressed through the row decoder 13, causing the charge in the cell's capacitors to be further discharged, and then immediately recharges the capacitor to its full state by the refresh process. Further details of the refreshing process and individual cell construction is explained below with respect to FIGS. 6 and 7. The known techniques of refreshing DRAMs are numerous. There are also many known DRAM system architectures.

The array 60, in the example of FIG. 1, is shown to be arranged in two functionally different sections or portions 65 and 66. The portion 65 includes rows and columns of conductors, either continuous or broken into segments, with switching transistors connected to selectively interconnect columns and rows of conductors, and/or connect segments of such rows and columns together in various configuration segments.

The second portion 66 of the array 60 includes configurable logic units and configurable input-output circuits that are connected to receive and send signals on column conductors extended from the portion 65 of the array 60. Thus, the interconnecting FET switches within the array portion 65 interconnect signals between the various logic units and input-output circuits within the array portion 66. Of course, logic units can alternatively, or additionally, be connected to row conductors within the array portion 65. A rather simple system architecture has been chosen for illustration as a basis for explaining the principles of the various aspects of the present invention and their preferred implementation.

Conductors 67 illustrate signal outputs of circuits in the array portion 66, and are connected to external pins on the package. Similarly, some external package pins are connected to input lines 68 to the circuits. Alternatively, external connections, such as line 55, can be bi-directional with their function set upon configuration of their respective input-output circuits. Conductors 69 and 70 are extensions of the row and column conductors, respectively, of the array 60. These optional extensions allow connection with similar conductors of other arrays in order to expand the system further, either on a single chip, or on multiple chips, either within a single package or in separate packages.

The types of logic units that may be included in the region 66 are many. In the specific simplified example being described herein, two types of logic units are used, both of which are configurable. A first is a logic gate having a look up function with two inputs and one output, the function of the gate being configurable as standard gate types such as OR, AND, NOR, exclusive OR, and so forth. More complex gate structures, such as those with more inputs and/or outputs can also be included. Any logic function can be implemented, including, in addition to the functions listed above, a multiplexer, a transistor, a tri-state buffer, and others. The second type of logic unit illustrated in this example is a D-type flip-flop. A preferred logic unit includes a four input, one output look-up logic function, one flip-flop and a tri-state driver, as described below with respect to FIG. 29. Input-output circuits within the portion 66 of the array 60 include proper buffering and control portions to interface between column lines of the array 60 and outside signals.

The logic units are configurable by loading the proper states into associated memory cells of the array 11. A portion 71 of the memory array 11 contain cells whose outputs are connected, such as by four line 72 from four memory cells, to one of the configurable gate logic units contained within the region 66 of the array 60. An example of such a logic unit is described below with respect to FIG. 4. In addition to the four configuration signal lines 72, another line 73 connects the output of a memory cell within another region 74 of the memory array 11 that allows signal nodes within the configured logic units to be accessed through the RAM array 11.

A flip-flop logic unit within the array portion 66 is also configured by the state of a memory cell within the portion 71 of the RAM array 11, that state being communicated over a line 75. Another portion 76 of the RAM array 11 contains memory cells which may be written to for the purpose of forcing the state of the flip-flop logic units, signals to do that being communicated from the memory cells to the flip-flop logic unit over lines 77. The memory cells in the portion 76 provide a control of the operation of the logic units within the array portion 66, as opposed to configuring their connection or function.

Similarly, the individual switching transistors within the portion 65 of the array 60 are controlled to be in an on or off state by the state of one of the associated memory cells within a region 78 of the RAM array 11. Lines 79 are shown in FIG. 1 to communicate the states of four of these memory cells with four respective switching transistors in the portion 65 of the array 60.

The two arrays 11 and 60 of separate rows and columns of electrical conductors are shown in FIG. 1 to be separate in order to illustrate their separate functions. The array 60 includes a large number of switching transistors whose states are controlled by contents of individual memory cells within the array 11. However, these two arrays are, according to the present invention, superimposed on each other across a common area of the semi-conductor substrate. The layout of different portions of this combination are conceptually illustrated in FIGS. 2A–5.

Switching Cell and Configurable Logic Cell Array

Figure 2A:
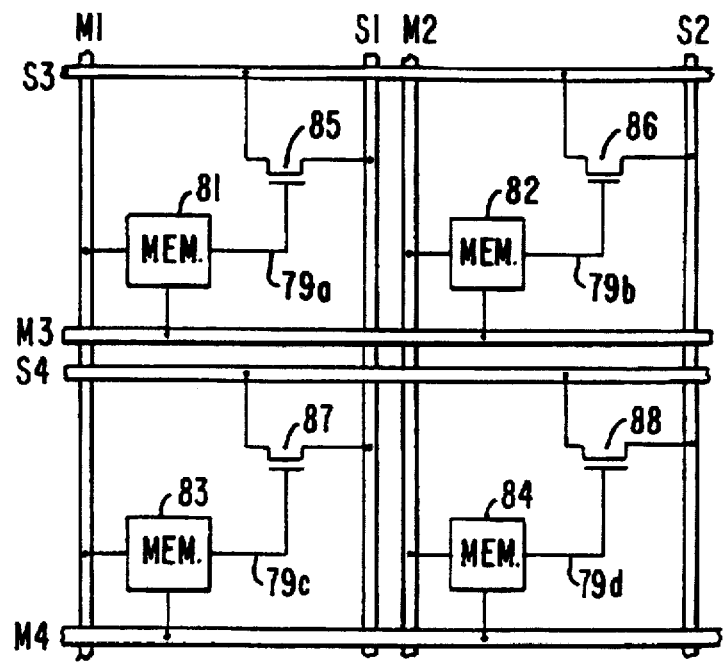
FIGS. 2A and 2B show two integrated circuit chip layouts of example switching cells included within the integrated circuit of FIG. 1.

FIG. 2A illustrates, in a plan view across an integrated circuit surface, four adjacent cells of the cross-point switches within the region 65 (FIG. 1) and their associated controlling memory cells 81–84 (FIG. 2A) which reside in the portion 78 of the array 11. The state of each of these memory cells 81–84 controls whether each of the respective switching transistors 85–88 is conductive or not. Each of the memory elements is programmable through its array of conductors, shown in FIG. 2A to include column conductors M1 and M2, plus row conductors M3 and M4. Each of the memory elements 81–84, as is clear from FIG. 2, is connected to one of these column conductors and one of these row conductors in order that they can be individual addressed for reading, writing and refreshing.

The switching network of FIG. 2A is formed by column conductors S1 and S2, and row conductors S3 and S4. It may be noted from FIG. 2A that each of the switching transistors 85–88 is connected to one of these column conductors and one of these row conductors. A connection between crossing row and column conductors is made by energizing the gate of the switching transistor connected to these conductors.

In the example of FIG. 2A, the rows of conductors from both of the arrays, namely conductors S3, M3, S4 and M4 are formed in a single metal layer within the integrated circuit structure. Similarly, the column conductors M1, S1, M2 and S2 are formed on a second metal layer insulated from the first. Thus, the conductors of each of the arrays 11 and 60 (FIG. 1) are combined on each of the two metal layers in the integrated circuit structure. Each of the four cross-point switching cells illustrated in FIG. 2A thus has two column lines and two row lines passing through it. Because of the simplicity and compactness of existing DRAM technology, each of the memory cells 81–84 is very small, which results in each of the four combined cells of FIG. 2A being very small. Indeed, the limit of how small each of these cells can be made is that of the pitch of the metal conductors. Thus, it may be desirable to form a third, and even a fourth metal layer in order to further vertically stack the conductors of FIG. 2A in order to reduce the amount of area taken by each of the switching cells.

The type of switching array illustrated in FIG. 2A, if extended throughout the portion 65 of the array 60, provides a full cross-point (cross-bar) switch. That is, any column conductor can be connected to any row conductor. Thus, logic units within the region 66 of the array 60, which are connected to the column conductors extending from the switching portion 65 to carry signals between configured logic units, can be connected to any other column conductor through the large number of row conductors. This is desired in order to provide maximum flexibility in implementing a planned interconnection of logic units, and thus reduces the complexity of determining the values to be loaded into the individual memory cells in order to make such connections.

However, a full cross-point switching network does require a large area on the integrated circuit, an area which can be reduced in appropriate circumstances by reducing the number of row conductors within the portion 65 to less than the number of column conductors, or some other appropriate arrangement. Such a reduction then generally means that the job of designing a routing path between logic units to form a specific circuit becomes more difficult and time consuming.

Figure 2B:
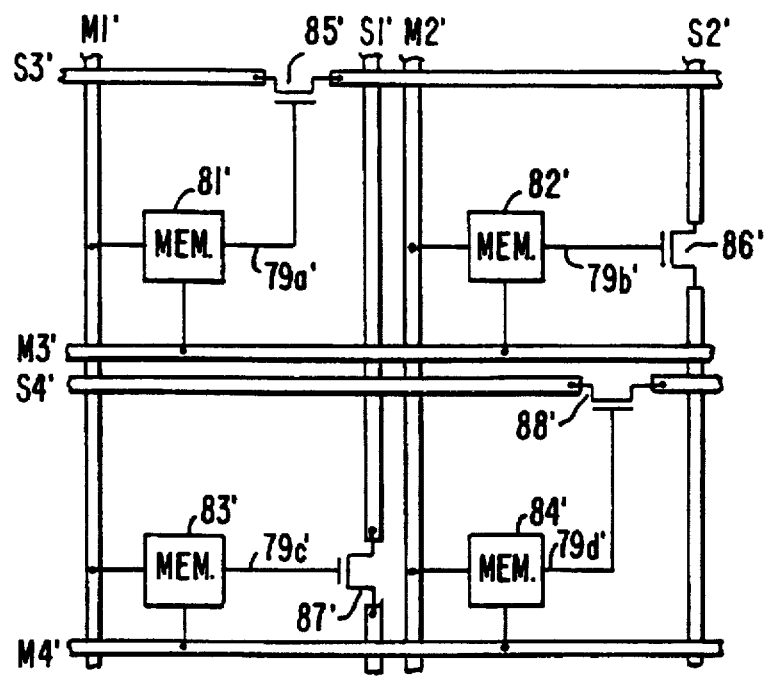

It may be desirable in certain applications of the full cross-point switching array discussed above to be able to break some or all of the column and row conductors into isolated segments. This is especially desirable, however, when a full cross-point switching network is not provided since a single conductor can then be used to carry more than one signal in its separate segments. A layout of such a circuit is illustrated in FIG. 2B, which is shown as a modification of the layout of FIG. 2, all elements identified by the same reference number having a prime (') added. Instead of the transistors 85–88 (FIG. 2A) selectively interconnecting row and column conductors together, transistors 85'–88' are connected in the path of the various row and column conductors. Each such conductor is then maintained as one, or separated into two segments, depending upon the value stored in its transistor switch controlling memory cell.

The present invention may also be used to implement various other conductor connection arrangements that are utilized in commercially available FPGAs where full cross-point connectivity is not provided. An example is a switching network including a number of individual switching transistors that can be programmed in a manner to form any combination of connections between three or more pairs of conductors. In such an application, each switching transistor of such a network has a state controlled by the contents of an associated storage cell of the DRAM array.

Figure 3A:
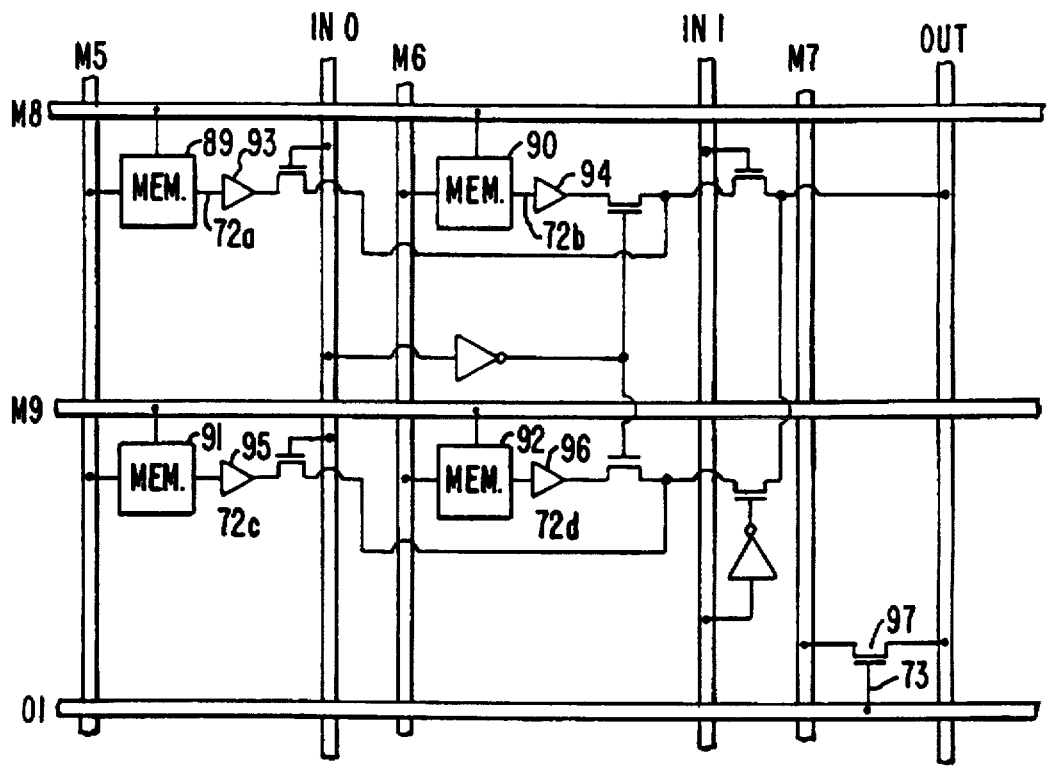
FIG. 3A shows an integrated circuit chip layout of an example logic unit included within the integrated circuit of FIG. 1.

Referring to FIG. 3A, an example of a logic unit contained within the portion 66 of the array 60 (FIG. 1) is illustrated. For simplicity, a configurable logic gate having two inputs IN0 and IN1, carried on two column conductors, and a single output signal OUT carried by another column conductor. The signal conductors extend into the cross-point switch portion 65 of the array 60 and are there connected to other logic units within the region 66 through the switching network. Column conductors M5, M6 and M7 are part of the memory array 11, as are row conductors M8 and M9. Another row conductor O1 is within the observability array portion 74 of the memory array 11.

The function of the simple logic circuit illustrated in FIG. 3A is configured by the contents of four memory cells 89–92 of the RAM array 11 (FIG. 1). That function is illustrated in a block circuit diagram of FIG. 3B, which uses the same reference numbers. Effectively, the four possible combinations of digital input signals in column conductors IN0 and IN1 operate a multiplexer circuit 56 shown to select the contents of one of the memory cells 89–92 for presentation at the OUT conductor. Whether the circuit functions as an OR, AND, or some other logical function, depends upon the contents of these four memory cells. Logic units formed to accommodate a larger number of inputs than the two inputs illustrated use more memory cells to configure their function. For example, as can be seen by reference to FIG. 3B, the preferred four input (the inputs IN0 and IN1 shown, and additional inputs IN2 and IN3 not shown) logic unit utilizes an increased capacity multiplexer 56 in order to be able to switch between a total of up to sixteen memory cells. Alternative to the technique used to implement a logic unit in the example of FIG. 3B, a technique of storing a logic look up table in a two dimensional array of memory cells may also be utilized but is not preferred.

It will be noted that each of the memory cells 89–92 of FIG. 3B drives one of the buffers 93–96. Rather than connecting the memory cell directly to the switching transistors, as is done in the switching network examples of FIGS. 2A and 2B, it is necessary to provide a source of current along with each of the memory cells when they are of the DRAM type. As illustrated and discussed below, drawing current out of such a memory cell rapidly depletes the charge stored in the cell and can quickly change its state. Thus, the charge stored in each DRAM cell, where an output current is required, is connected to a buffer in order to control the buffer's output current between two levels depending upon the level of charge stored in the memory cell.

The observability feature of the present invention is also illustrated in FIG. 3A, implemented with a switching transistor 97 connected between the output column conductor OUT and one of the memory array column conductors M7. The transistor 97 is rendered conductive or not depending upon the voltage on the RAM array row line O1. Thus, when the row line O1 is addressed through the row decoder 13 (FIG. 1), the output of the circuit of FIG. 3A is connected to the column line M7. This then allows a selective observing or monitoring of this output through the RAM array 11. Because of the easy random accessibility of such an array, signals on internal nodes of the configured circuit may be easily accessed and observed.

Figure 4:
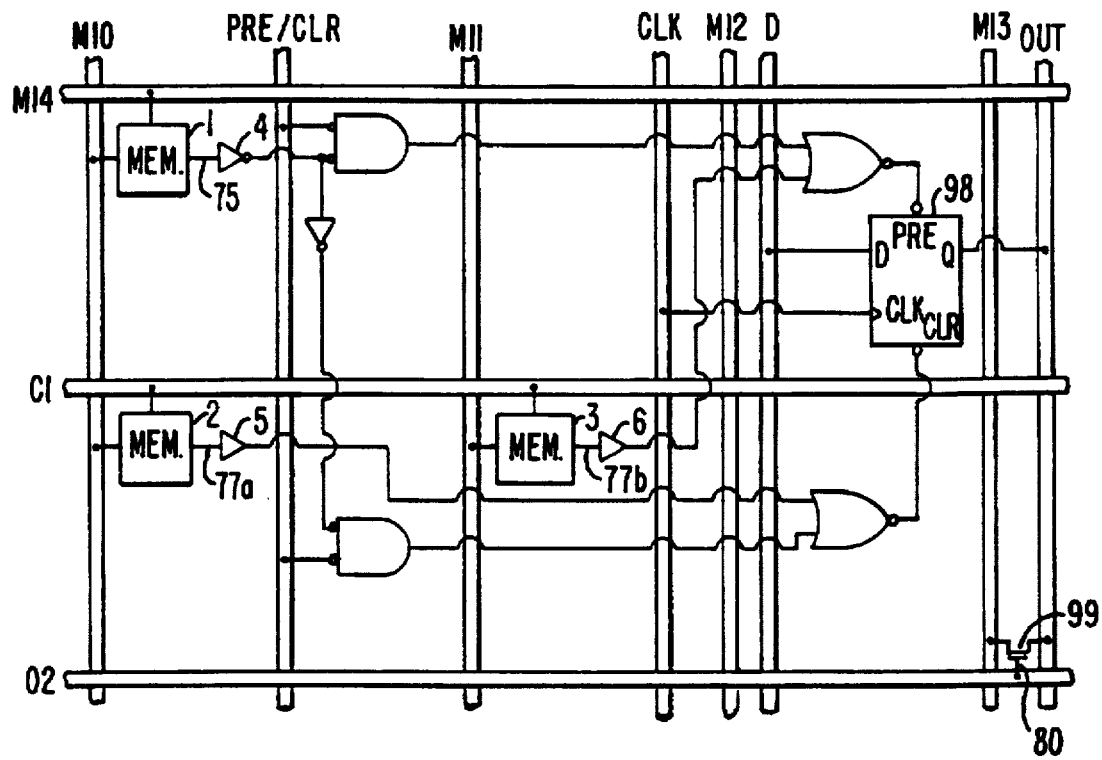
FIG. 4 shows an integrated circuit chip layout of another example logic unit included within the integrated circuit of FIG. 1.

FIG. 4 shows another type of logic unit which may be utilized within the portion 66 of the array 60 (FIG. 1), namely a D-type flip-flop. A flip-flop circuit 98 has its Q output connected to an OUT column conductor and its D input connected to a D column conductor. A clock input to the flip-flop 98 comes from another column conductor identified by CLK. A signal to either preset or clear the flip-flop 98 is applied from another column conductor indicated by PRE/CLR through the logic elements shown. Whether an active signal on the PRE/CLR column conductor causes flip-flop 98 to preset or clear itself is determined by the state of the memory cell 1 which conditions the clear and preset signals through an inverter 4 and various logic elements shown.

Two additional memory cells 2 and 3, driving respective buffers 5 and 6, allow the flip-flop 98 to be forced into either a cleared or a preset state without affecting the configuration set by the contents of the memory cell 1. The memory cells 2 and 3 are both connected to a row conductor C1 of the controllability portion 76 of the RAM array 11. These memory cells 2 and 3 can be randomly accessed and their contents changed when it is desired to control the operation of the flip-flop 98. As an alternative to the controllability memory cells being connected to a common row (word) conductor, as shown in the drawings, they can be dispersed among the configuration logic memory cells.

There is a distinction between the configuration and controllability functions performed by the example circuits of FIGS. 2A–4. Bits stored in configuration memory cells either establish connections that form a circuit over which signals travel or conditions how the circuit will respond to a given signal. The state of the memory cells in the circuit of FIGS. 2A and 2B directly establish circuit connections. The state of the memory cells in the circuit of FIG. 3A sets up the logic transfer function between its inputs and its output. The state of the memory cell 1 of FIG. 4 conditions the circuit to respond in a particular way to an active signal in the PRE/CLR line. Bits stored in controllability memory cells, on the other hand, set values of signals within the established circuit. Bits written into the cells 2 and 3 of FIG. 4, for example, will force the flip-flop 98 into a predetermined state, thus controlling the state of its output signal on the conductor OUT.

The circuit of FIG. 4 also includes an observability function. A FET switch 99 interconnects the output of the flip-flop 98 to a memory array column line M13. The gate of the FET 99 is connected through line 80 to a memory row conductor 02. Thus, when the state of the signal on the row 02 becomes active, the output of the flip-flop 98 may be read through the memory array. This is a significant advantage when testing or emulating a circuit that is configured on the chip. It is important to be able to determine the states of flip-flops internal of the operating circuit.

Although the example circuit layouts conceptually illustrated in FIGS. 3A and 4 cause their respective observability transistors 97 and 99 to be conductive by signals on separate memory row lines 01 and 02, they can be combined to respond to a single row line. Indeed, many such observability FET switches can be controlled by the signal on one row line. The result is the simultaneous access through a number of column lines of signals at a number of internal circuit nodes.

It will also be noticed that the example circuits of FIGS. 3A and 4 alternate memory and logic circuit column conductors across their layouts. This is usually the most convenient arrangement, even though not all the memory column conductors are used (such as M12 in FIG. 4), since those unconnected to one logic unit will be connected to another.

Figure 5:
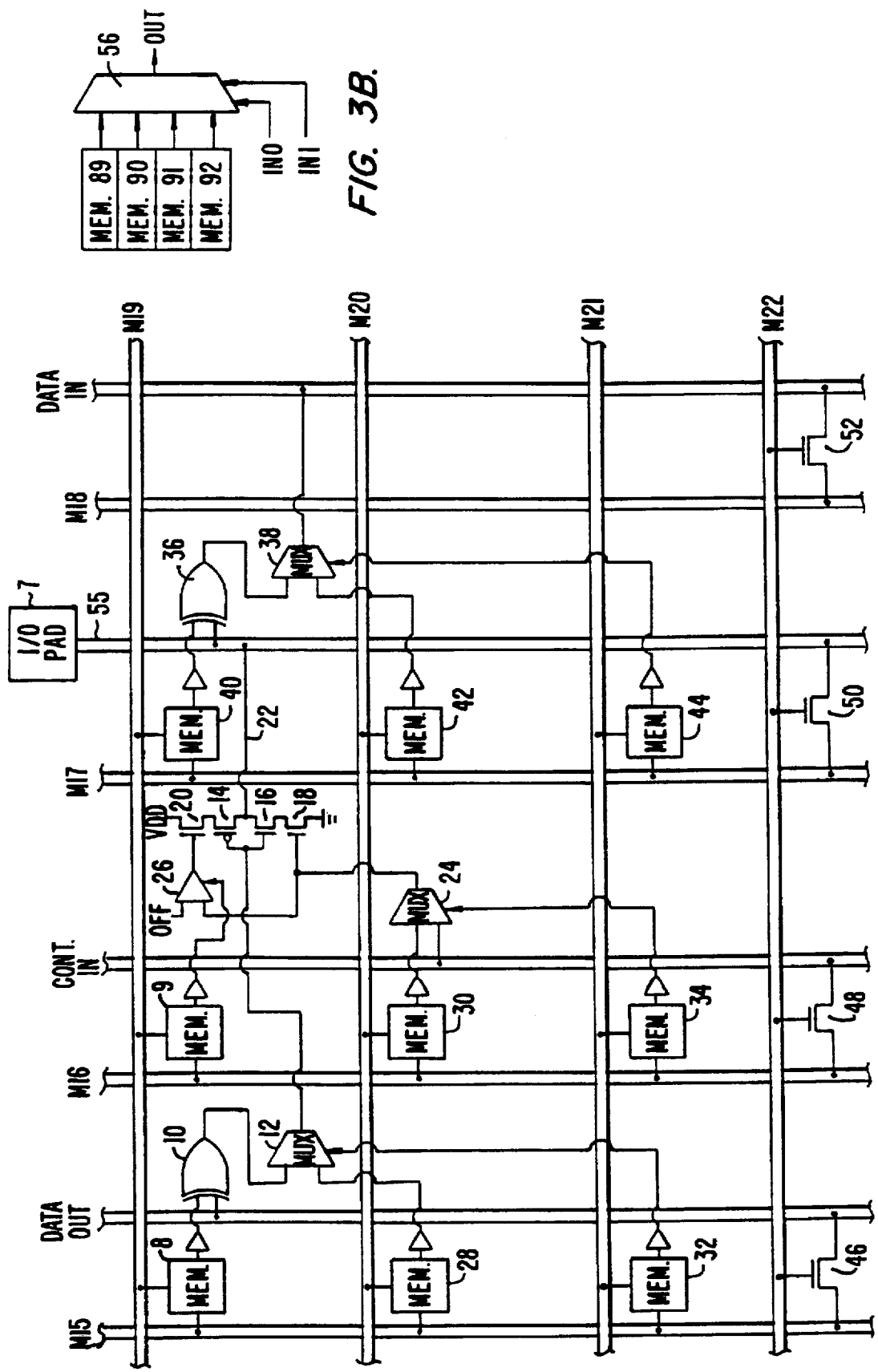
FIG. 5 shows an integrated circuit chip layout of an input/output unit included within the integrated circuit of FIG. 1.

FIG. 5 conceptually shows a layout for an input/output circuit of a type that can be repeated in the region 66 of the array 60 (FIG. 1). The conductor 55 connects with a circuit chip pad 7, which can serve as either an input or an output to the circuit being configured on the chip, in response to the value of a control bit on a CONT. IN column line from outside of the circuit of FIG. 5. If operating as an output circuit, a signal on the DATA OUT column conductor from some other configured logic unit is transferred onto the column conductor that is connected to the pad 7. If operating as an input circuit, the signal on the pad 7 is transferred to a DATA IN column conductor for use by some other configured logic circuit on the chip.

Memory cells 8 and 9 provide the primary configuration information for the circuit of FIG. 5 when being used to provide an output. The content of the memory cell 8 configures the circuit to accept a particular polarity of signal on the DATA OUT column conductor, by providing one input to an exclusive OR-gate 10 whose other input is the DATA OUT signal. The gate 10 controls, through a multiplexer 12, the gates of output transistors 14 and 16. Transistors 14 and 16 are connected in a series circuit, with additional transistors 18 and 20, across the power supply voltage. The value of the signal on the DATA OUT conductor thus drives, through the gate 10 and multiplexer 12, an output of this series transistor circuit in a line 22 connected to the column conductor to which the pad 7 is connected.

This output function will operate only, however, when the control bit on the CONT. IN column line designates the output function. It does this by a connection, through a multiplexer 24, to the gates of the transistors 18 and 20. When these transistors are turned off, no output is provided on the line 22, but when turned on, allows the circuit to provide an output to the pad 7. The signal to the transistor 20 is selectively interrupted by a gated buffer 26, depending upon the content of the memory cell 9. This then allows the output 22 to be configured as an open collector output when the bit in the memory cell 9 causes the transistor 20 to be turned off while the signal on the CONT. IN column conductor causes the transistor 18 to be turned on.

Memory cells 28 and 30 provide an output circuit controllability function. The multiplexer 12, in response to a configuration bit in a memory cell 32, can select the content of the memory cell 28 as the signal to be provided as an output, in place of the actual signal in the DATA OUT column conductor. Similarly, the multiplexer 24, in response to a configuration bit in a memory cell 34, can substitute the content of the memory cell 30 as a control signal in place of an actual control signal on the CONT. IN column conductor.

When it is desired to operate the circuit of FIG. 5 as an input circuit, the control signal on the CONT. IN conductor is set to that which maintains the transistors 18 and 20 in their off (non-conductive) states, or the multiplexer 24 selects the content of the memory 30 to turn off the transistors 18 and 20. Any signal on the pad 7 then passes through an exclusive OR-gate 36 and a multiplexer 38 to the DATA IN column conductor for use as an input signal to some other configured logic unit. A configuration bit in a memory cell 40 adapts the circuit for the polarity of the input signal. A controllability bit in a memory cell 42 may be substituted for such an actual input signal, in response to the content of a configuration memory cell 44.

Observability of signals on certain conductors within the circuit of FIG. 5 is provided by transistors 46, 48, 50 and 52. Each of these transistors is rendered conductive or non-conductive by the signal on a memory row conductor M22. When these transistors are conductive, the signal on the DATA OUT conductor is connected to a memory column conductor M15, the control signal on the CONT. IN conductor to the memory array conductor M16, the signal on the pad 7 to the memory conductor M17, and the input signal on the DATA IN conductor to the memory conductor M18. With this arrangement, the memory column conductors M15, M16 and M17 are used at different times to both access the memory cells connected to them and allow signals on conductors of the circuit to be observed over them from outside of the integrated circuit chip.

Memory Cell Design

A variety of different types of DRAM based memory cells can be used in the structures of FIGS. 1–5. A discussion of prior art DRAM memory cells is relevant here.

Figure 6:
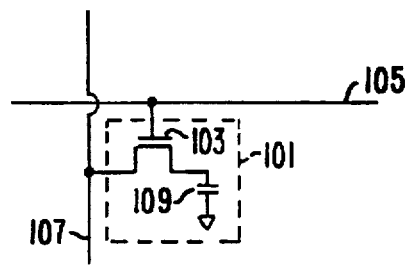
FIG. 6 is a schematic view of the prior art DRAM cell.

FIG. 6 is a schematic view of the prior art DRAM memory cell 101. Memory cell 101 comprises an access transistor 103 that has its gate connected to a row line 105 and its source connected to column line 107. The drain of access transistor 103 is connected to a capacitive element 109. This capacitive element is typically formed out of a trench capacitor.

The row line 105 and column line 107 are usually metal lines formed in metallization steps. In DRAM memory systems, the capacitive element 109 loses charge due to a leakage to the substrate. For this reason, the value in the capacitor 109 needs to be refreshed periodically. In a refresh operation, the column line 107 is precharged to a voltage value between the voltage corresponding to logical "one" and the voltage corresponding to logical "zero". Typically, five volts corresponds to logical "one", zero volts corresponds to logical "zero", and the precharge voltage is 2.5 volts. As described below, it is understood that the FPGA chips of the present invention may use a lesser voltage for the logical "one" case. It typically takes about 50 ns to precharge column line 107. After column line 107 is precharged, the voltage at the row line 105 is set high turning on the access transistor 103.

Figure 7:
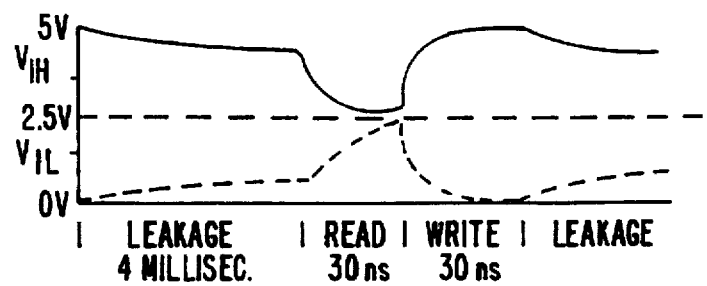
FIG. 7 is a graph of the voltage at the capacitor of the memory cell of FIG. 6 for a logical "one" and logical "zero" during the leakage, the read and the write period of the memory cell.

The activity of the DRAM cell 101 during the read and write-back periods is best described with respect to FIG. 7. FIG. 7 is a graph of a voltage at the capacitor of the memory cell of FIG. 6 for logical "one" and a logical "zero" during the leakage, the read and the write period of the memory cell 101. The time scale of this graph and the graphs of FIGS. 12, 14, 16, 17, 19, 20, 22, and 23 is distorted. The leakage period is much greater than the read or the write periods. The leakage period or the longest period of time in between refreshes of the capacitor 109 is illustratively around 4 milliseconds. The voltage at the capacitor 109 of the memory cell 101 of FIG. 6 is shown in FIG. 7 as being a continuous line for the logical "one" case and is shown as a dotted line for the logical "zero" case. As shown in FIG. 7, the voltage at the capacitor 109 during the leakage period slowly lowers in the logical "one" case and rises for the logical "zero" case. This voltage change is due to the leakage of charge on the capacitor through the substrate. The precharging of the line 107 of the DRAM memory cell 101 is not shown in the graph of FIG. 7. The precharge period occurs right before the read period.

When the read period begins, access transistor 103 is turned on. In the logical "one" case, charge from the capacitor 109 goes to the column line 107 and in the logical "zero" case charge from the column line 107 goes to the capacitor 109. A slight change of the voltage on the column line 107 is sensed by a sense amp (not shown) attached to column 107. A read period typically takes about 30 ns.

The sense amp can tell whether a logical "one" or a logical "zero" was stored in capacitor 109. During the write period, the value that was stored in capacitor 109 is written back into the capacitor 109 through the column line 107. The value in the capacitor is refreshed to 5 volts for the logical "1" case and 0 volts for the logical "zero" case. After the read and write periods the value on the row line 105 is set low.

DRAM memory cells are typically refreshed a row at a time so that an entire row of memory cells are read and written back to at the same time. This effectively means that during the longest allowable leakage period, each of the row lines must be refreshed. Assuming that the longest allowable leakage period is 4 milliseconds and that there are 256 rows, one row must be refreshed every 15.6 microseconds. Since it takes 110 nanoseconds to precharge, read, and write a row of memory cells, the refreshing of the rows will require less than two percent of the access time of memory cells such as memory cell 101.

Figure 8:
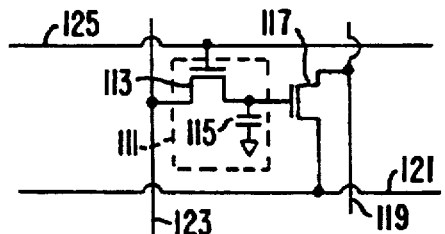
FIG. 8 is a schematic view of one embodiment of the present invention showing memory cell consisting of an access transistor and a capacitive element connected to a switch interconnecting two lines.

A first manner of using a DRAM based memory cell as the memory cell shown in FIGS. 1–5 is described below. FIG. 8 is a schematic view of one embodiment of the present invention showing a memory cell 111 consisting of an access transistor 113 and a capacitative element 115 connected to a switch 117 interconnecting two lines 119 and 121. FIG. 8 also shows the column line 123 and the row line 125 connected to the access transistor 113 of the memory cell 111. The memory cell 111 and switch 117 may be used as the memory cell and switch shown in FIG. 2A. Looking again at FIG. 8, the memory cell 111 is similar in characteristics to the DRAM memory cell 101 of FIG. 6. Since the memory cell 111 of FIG. 8 is connected to the gate of transistor 117 having a very high impedance, the voltage at the capacitor 115 during the leakage, write and read periods can be shown by the graph of FIG. 7. Possible problems may occur during the read and write periods when the voltage at the capacitor 115 rises above the low switching voltage ($V_{IL}$) of transistor 117 for the logical "zero" case or below the high switching voltage ($V_{IH}$) for transistor 117 for the logical "one" case. In either case, the state of the switching transistor 117 will be incorrect so that the value of any signals on interconnect line 119 and 121 will not be accurate. For this reason, it was considered impractical to use a DRAM memory cell, such as memory cell 111, to control interconnect switches or to hold configuration data bits in a FPGA chip. Typically, prior art FPGA chips use SRAM memory cells that do not require refreshing.

Using the circuit shown in FIG. 8 in an FPGA may be possible if limitations are placed on the type of circuits to be emulated or placed upon the FPGA. One such limitation is that the circuit to be placed in the FPGA chip only maintains information in a synchronous manner such as by using flip-flops which are clocked by a system clock. An example of a circuit that stores information asynchronously is combinatorial logic that has an output feeding back to an input without using a system clock.

If circuits that store information asynchronously are placed in a FPGA using memory 111, the information stored in these asynchronous circuits will be destroyed when the capacitor 115 is read during a refresh of the memory cell 111. However, if information in the circuit placed in the FPGA is stored in Flip-Flops clocked by a system clock, the refreshing of the capacitors in a memory cell such as memory 111 can be timed so that no information is lost.

Figure 9:
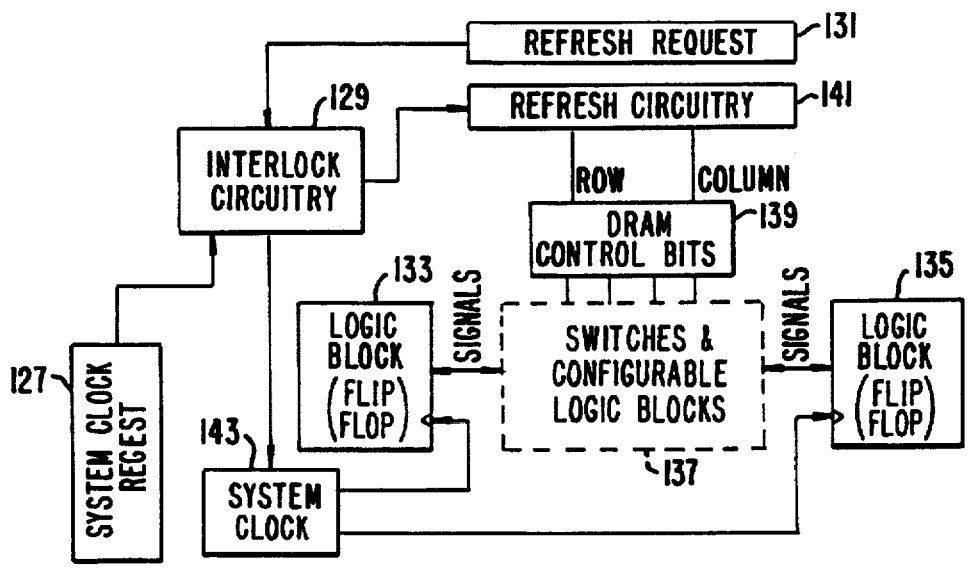
FIG. 9 is a block diagram showing a section of an emulated circuit on the FPGA plus the interlock circuitry required for the use of the memory cell type shown in FIG. 8.

FIG. 9 is a block diagram showing a section of an emulated circuit on the FPGA plus the interlock circuitry 129 required for the use of the memory cell 111 shown in FIG. 8. If a system clock is to be sent to flip-flops 133 and 135 which are part of the circuit placed on the FPGA, a system block clock request block 127 sends a request to the interlock circuitry 129. Additionally, if a row is required to be refreshed, a refresh request is sent by refresh request circuitry 131 to the interlock circuitry 129. The interlock circuitry 129 arbitrates between the system clock request and the refresh request such that for example, signals can be sent from flip-flop 133 to flip-flop 135 before the system clock causes flip-flop 135 to input data. No refresh signals can be sent to the flip-flops in the period of time corresponding to the longest delay time before the system clock signal is sent. The largest signal delay time between two flip-flops may be 50 to 250 nanoseconds. The signals between logic block 133 and logic block 135 are sent through the switches and configurable logic block section 137. The switches and configurable logic block section 137 is under the control of DRAM control bits 139 constructed of memory cells such as memory cell 111 of FIG. 8. Looking again at FIG. 9, if the value of the DRAM control bits and DRAM control bit circuitry 139 are in an uncertain state because of a refresh of a row, the correct signals might not be sent to the logic block 135. The interlock circuitry 129 sends an signal to the refresh circuitry 141 or to the system clock 143 if there is no conflict.

Figure 10:
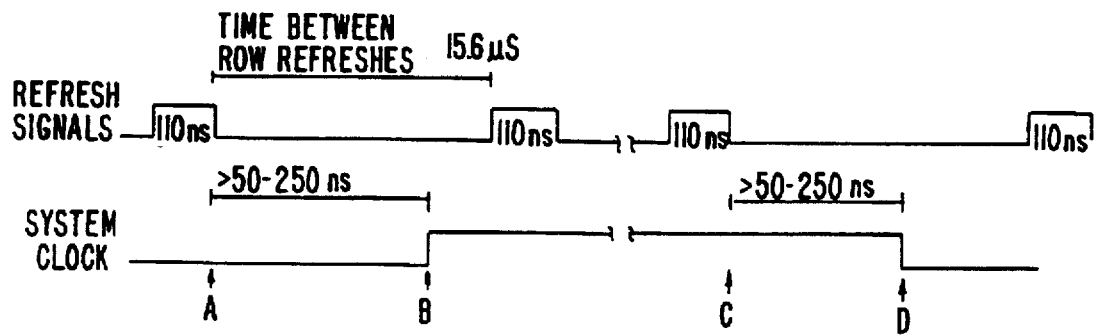
FIG. 10 is a timing diagram used to explain limitations on the use of the memory cell shown in FIG. 8.

FIG. 10 is a timing diagram used to explain limitations on the use of memory cell shown in FIG. 8. The refresh signals line shows a refresh which is typically 110 ns long. This row refresh would typically occur once every 15.6 microseconds. After a row refresh, the system clock should not trigger for the period of time equal to the longest delay time between flip-flops. Note that the time between the refresh of a row at time A and the clock transition at time B is greater than the 50 to 250 nanoseconds time period of the longest time delay. Optionally, if the system clock is triggered on a down transition at time D, the time between the refresh signal at time C and the clock trigger at time D is greater than the longest delay time between flip-flops. Notice that a number of row refreshes can occur in between clock transitions. In addition, a number of clock transitions could occur between row refreshes. Since the circuit information is contained in the flip-flops, no information is destroyed when the DRAM control bits 139 shown in FIG. 9 are of an uncertain condition as long as enough time is given for the signals to move from flip-flop 133 to flip-flop 135. Note that the DRAM based memory cells like memory cell 111 of FIG. 8 should not be connected to asynchronous inputs of the flip-flops 133 and 135 of FIG. 9.

The second and preferred manner to use a charge storing memory cell in an FPGA chip is to make modifications to the basic DRAM memory cell. FIGS. 11A, 13A, 13B, 15, 18, and 21 disclose charge storing memory cells which can be used in the circuits of FIGS. 1–5. As described below, these memory cells maintain the state information of a switch or driver element during the refreshing of the memory cell. For example, if these memory cells are connected to the gate of a switch, during the read and write portions of the memory cell refresh, the voltage at the gate is maintained greater than $V_{IH}$ for the logical "one" case and less than $V_{IL}$ for the logical "zero" case. In this manner, the switch will not inadvertently change states (i.e go from conducting between the source and drain to not conducting between the source and drain or vice versa) during a refresh of the memory cell.

Figure 11A:
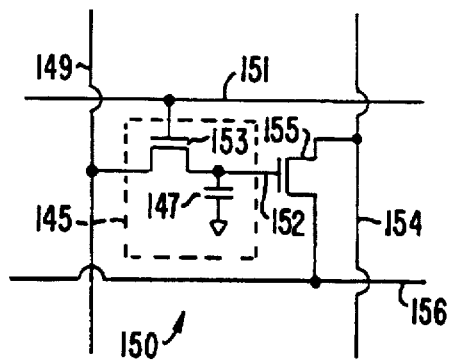
FIG. 11A is a schematic view of an embodiment of the present invention using a memory cell with a large capacitive element.

FIG. 11A is a schematic view of an embodiment of the present invention using a memory cell 145 with a large capacitive element 147. This figure shows a switching cell 150 comprised of the memory cell 145, a dedicated connection 152, and a switch 155. The dedicated connection 152 uniquely connects memory cell 145 and switch 155 and is exclusively used for connecting these elements. In the embodiment shown, the dedicated connection 152 is a hardwired polysilicon connection. A sole dedicated connection 152 is desirable since the memory cell 145 is near the switch 155.

The switching cell 150 is in the vicinity of interconnect or signal lines 154 and 156. Switch 155 of the switching cell 150 is controlled by the memory state of the memory cell 145 and is connected between interconnect lines 154 and 156. The memory cell 145 stores the memory state for controlling the switch 155. The memory cell 145 is of the type that stores the memory state using stored charge which discharges over time and needs refreshing. The memory cells shown in FIGS. 8, 13A, 13B, 15, 18, 21, and 24 are also of this type. Generally, memory cells on an integrated circuit that use a capacitive element to store charge are of this type. Looking at FIG. 11A, the memory cell 145 is connected to circuity to read the memory cell state and rewrite the memory cell state into the memory cell 145 in a refresh described below. This refresh circuitry includes row line 151 and column line 149. A variety of refresh circuitry is well known in the art especially for use in DRAM memories.

Normally, in a DRAM memory cell, the capacitive element is kept small so that the writing and reading from the memory cell can be as quick as possible. Since the capacitance element of the DRAM cell is kept small, during the refresh of the DRAM memory cell, the voltage at the capacitive element approaches the precharge voltage as shown in FIG. 7. The large capacitor 147 maintains the memory controlled switch state during a read of the memory cell 145. The benefit of using a larger capacitor 147 can be seen with respect to FIG. 11B.

Figure 11B:
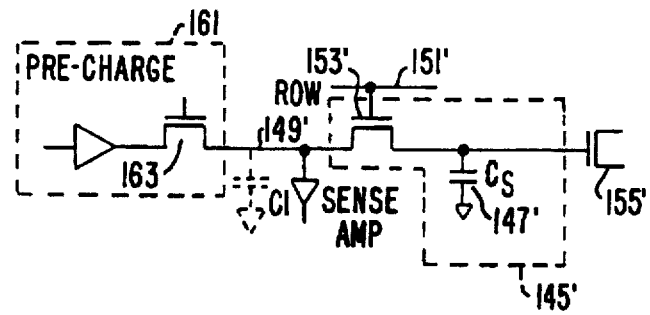
FIG. 11B is a schematic view showing some pre-charge circuitry including an inherent capacitance $C_1$ which is connected to the memory cell including the capacitive element $C_s$.

FIG. 11B is a schematic view showing a precharge circuitry 161 and a column line 149' with an inherent capacitance $C_1$ connected to a memory cell 145' including a capacitive element 147'. Precharge circuitry 161 connected to column 149' precharges the column line 149' to the precharge voltage, 2.5 volts. Next, transistor 163 in the precharge circuitry 161 is turned off. When the row 151' goes high during a read, the transistor 153' is turned on and a charge is distributed between capacitor 147' having a capacitance $C_s$ and the inherent capacitance C1 of the column line 149'. Since Q=CV, when a larger capacitance Cs is used in the memory cell 145', the voltage drop or rise due to charge moving from capacitor 147' to column line 149 is reduced. The value of Cs can be chosen with respect to $C_1$ such that the state of the transistor 155' does not change during the read period.

Figure 12:
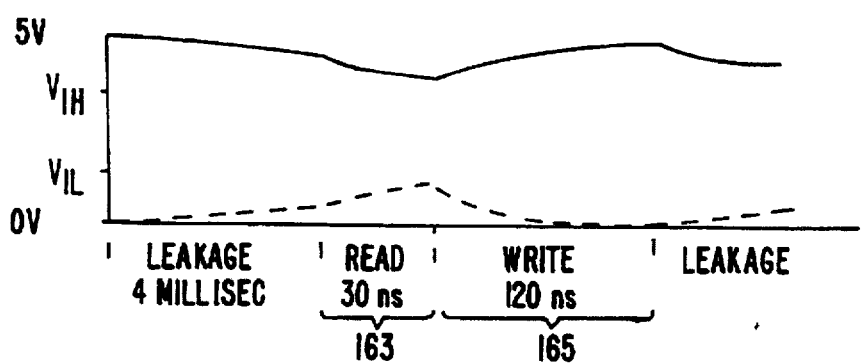
FIG. 12 is a graph of the voltage at the capacitor of FIG. 11A showing the voltage at this capacitor for a logical "one" and logical "zero" during the leakage, read, and write periods.

FIG. 12 is graph of the voltage at the capacitor 147 of FIG. 11A showing the voltage at this capacitor for a logical "one" and a logical "zero" during the leakage, read, and write periods. For illustrative purposes, in FIGS. 12, 14, 16, 17, 19, 20, 22 and 23, the signals are shown as ranging from zero to five volts. Note, that a memory cell of the present invention could be designed for circuits having a signal range of 0 to 3 volts or for any desired range of voltages. Also, in all of these figures, the dotted line corresponds to the logical "zero" case and the continuous line corresponds to the logical "one" case.

Looking again at FIG. 12, note that in the read period 163, the voltage for logical "one" case is maintained above the voltage $V_{IH}$ and the voltage of the logical "zero" case is maintained below the voltage $V_{IL}$. In this manner, the state of the switching transistor 155 can be maintained during the read period 163 and write period 165. For FIG. 11b:

$$Q=CV$$

$$Q_{1b}+Q_{sb}=Q_{ta}$$

$$V_{pr}C_1+V_{s1}C_s=V_{ar}(C_1+C_s)$$

$$\frac{C_s}{C_1} = \frac{V_{ar}-V_{pr}}{V_{s1}-V_{ar}}$$

where $Q_{1b}$ is the charge on capacitor $C_1$ before the read period, $Q_{sb}$ is the charge on capacitor $C_s$ before the read period, $Q_{ta}$ is the total charge after a complete read, $V_{pr}$ is the precharge voltage, $V_{s1}$ is the voltage on capacitor $C_s$ after leakage and $V_{ar}$ is the voltage on both capacitances after a complete read. Illustratively, if $V_{IH}$ is 3.5 volts and $V_{IL}$ is 1.5 volts for transistor 155', $V_{pr}$ is 2.5 volts and $V_{s1}$ is 4.5 volts or 0.5 volts for logical "one" or logical "zero" case, respectively, then $C_s$ should be greater than $C_1$. In addition, the read period may be shortened by adding a resistive element as described below so that the voltages on the two capacitances are not totally equalized in a read period. In this case, $C_s$ may be made somewhat smaller.

Looking at FIG. 12, note that the length of write period 165 needs to be expanded from the length of the write period of a typical DRAM memory cell. The write period needs to be expanded since a larger capacitor 147 is used. Since the write period 165 is expanded, the percentage of time used for the refresh of the memory needs to be increased. This increase is possible since the refresh cycle of a prior art DRAM memory comprises only one to two percent of the total memory access time. Typically, DRAM memory is an active memory in which the row refresh time needs to be kept as small as possible. Since the memory cell 145 in FIG. 11A is not being used as an active memory, the percentage of time the memory uses for row refreshes of this and other memory cells of the present invention can be significantly increased.

Figure 13A:
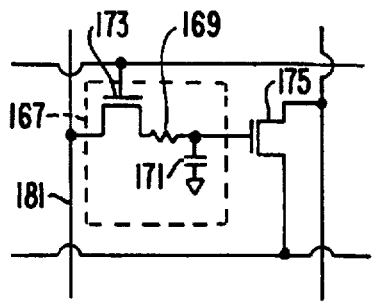
FIG. 13A is a schematic diagram of an embodiment of the present invention showing a memory cell with a resistive element located between the capacitor and the access transistor.

FIG. 13A is a schematic diagram of an embodiment of the present invention showing a memory cell 167 with a resistive element 169 located between the capacitive element 171 and the access transistor 173. This resistive element 169 and the resistive elements in the other memory cells described below are preferably resistive transistors. Capacitive element 171 may be a large capacitor like capacitor 147 shown in FIG. 11A or may be a smaller capacitor. Looking again at FIG. 13A, the use of a resistive element 169 slows the reading of the capacitor 171 such that the value of capacitor 171 can be read before the voltage at the capacitor 171 reaches the triggering voltage $V_{IH}$ or $V_{IL}$ of the switching transistor 175.

Figure 13B:
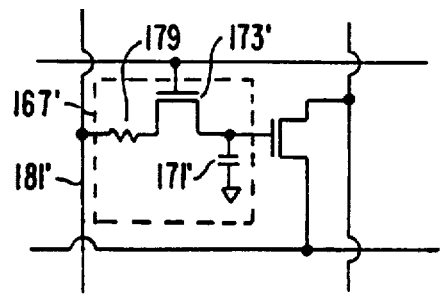
FIG. 13B is a schematic view of an embodiment of the present invention showing a resistive element placed between the column and the access transistor.

FIG. 13B is a schematic view of an embodiment of the present invention showing the resistive element 179 located between the column line 181' and the access transistor 173'.

The resistive element 179 located in this position will have the same effect as the resistive element 169 of FIG. 13A.

Figure 14:
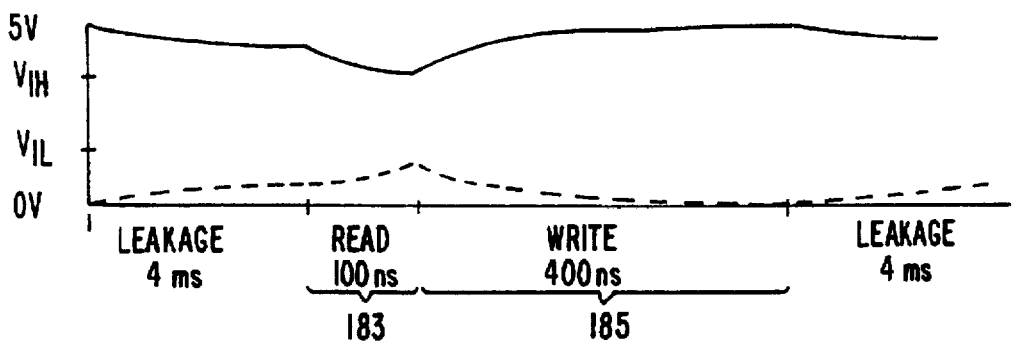
FIG. 14 is a graph of the voltages at the capacitor in FIG. 13A and 13B for a logical "one" or a logical "zero" during the leakage, read, and write periods.

FIG. 14 is a graph of the voltages at the capacitor 171 of FIG. 13A or the capacitor 171' of FIG. 13B for a logical "one" or a logical "zero" during the leakage, read, and write periods. Note that during the read period 183, the voltages and the capacitors 171 or 171' are for the logical "one" case are maintained above the voltage $V_{IH}$ and the voltages for the logical "zero" case are maintained below the voltage $V_{IL}$. In this embodiment, since the read proceeds slower due to the resistors 169 or 179, less charge is transferred between the capacitive element 171 or 171' and the column line 181 or 181' before the write period begins. Since less charge is transferred, the change of the voltage on the capacitive element 171 or 171' is less.

The length of the read period 183 and write period 185 are expanded because of the increased RC constant. This increased RC constant is due to the resistive elements 169 and 179. The increased read and write periods requires a greater amount of time for the refresh cycle.

Figure 15:
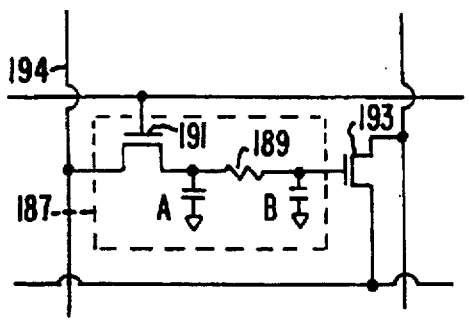
FIG. 15 is a schematic view of still another embodiment of the present invention showing two capacitors in the memory cell separated by a resistive element.

FIG. 15 is a schematic view of still another embodiment of the present invention showing two capacitors, capacitor A and B in the memory cell 187 separated by a resistive element 189. This memory cell 187 also has an access transistor 191. The resistive element 189 and capacitor B are used to maintain the state of the memory cell 187 while the value of the state of the memory cell is read from capacitor A in a refresh. Note that the voltage at the capacitor B is applied to the switching transistor 193.

Figure 16:
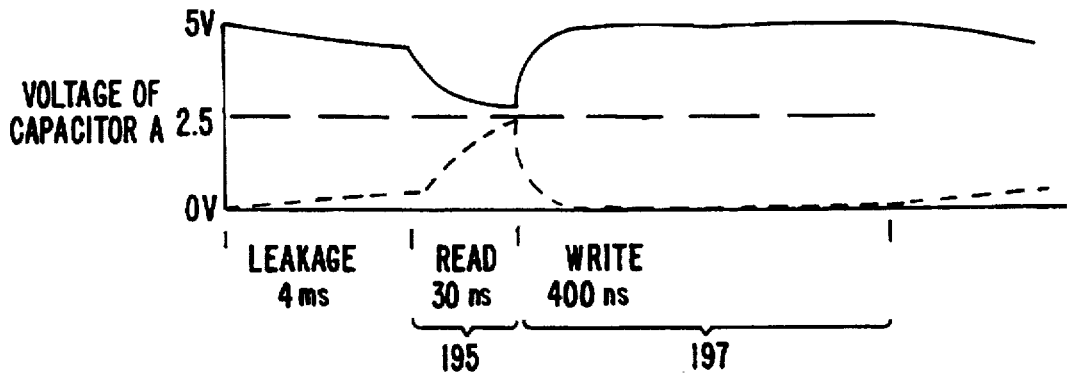
FIG. 16 is a graph of the voltage at capacitor A for a memory cell of FIG. 15 for a logical "one" or logical "zero" during the leakage read and write periods.

FIG. 16 is a graph of the voltage at capacitor A for the memory cell of FIG. 15 for a logical "one" or logical "zero" during the leakage, read, and write periods. During read period 195, the value of the capacitor A is read and the voltage at the capacitor moves towards the precharge voltage on line 194. During the write period 197, the correct voltage is written back into capacitor A.

Figure 17:
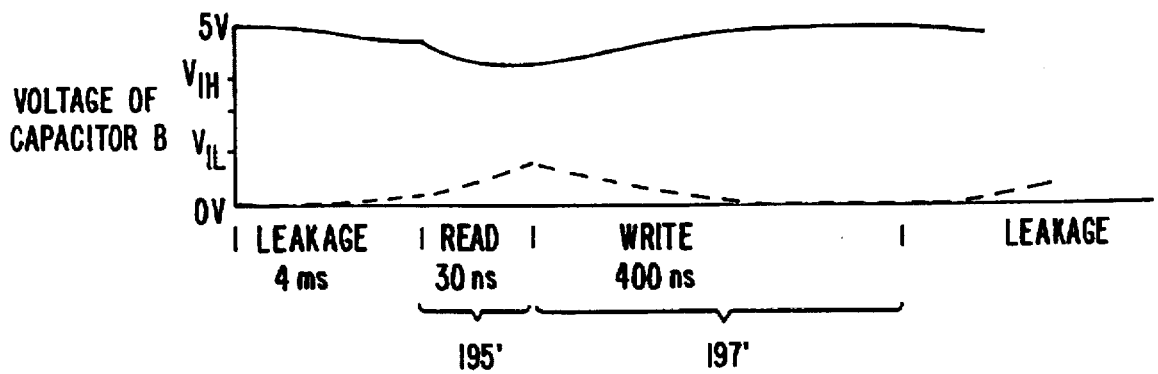
FIG. 17 is a graph of the voltage at capacitor B of the memory cell of FIG. 15 for a logical "one" or logical "zero" during the leakage, read, and write periods.

FIG. 17 is a graph of the voltage at capacitor B of the memory cell 187 of FIG. 15 for a logical "one" or a logical "zero" during the leakage, read, and write periods During the read period 195', the voltage on the capacitor B never rises above the voltage $V_{IL}$ for the logical "zero" case nor goes below the voltage $V_{IH}$ for the logical "one" case. This is because capacitor B is separated by the resistive element 189 from capacitor A. The resistive element 189 slows the transfer of charge from capacitor A to B. Note that an expanded write period 197' is required to write back a voltage at capacitor A and capacitor B to its original value. As an example, this write period may be 400 ns. The size of capacitor A may be slightly smaller than that of the capacitive element used in the normal DRAM memory cell since the capacitance of capacitor B affects the voltage on capacitor A somewhat.

Figure 18:
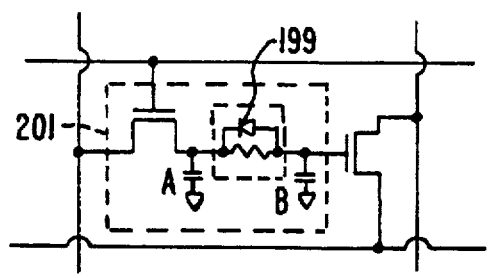
FIG. 18 a schematic view of yet another embodiment of the present invention showing a capacitor A and B separated by a leaky diode.

FIG. 18 is a schematic view of yet another embodiment of the present invention showing a capacitor A and B separated by a leaky diode 199. The leaky diode 199 is shown schematically as a diode in parallel with a resistive element. The memory cell 201 is used when the write back of a logic "zero" into capacitor B would take more time than write back of a logical "one" into capacitor B if capacitors A and B were separated by a resistive element alone. The diode speeds up the writing of the logical "zero" to capacitor B since if the voltage at capacitor B is 0.6 volts greater than the voltage at capacitor A, the leaky diode 199 is turned on. A leaky diode facing the other direction could be used if the writing of a logical "one" into capacitor B takes more time.

Figure 19:
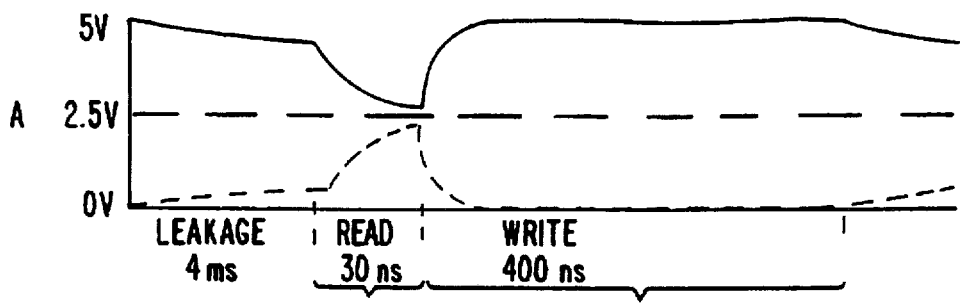
FIG. 19 is a graph of the voltage at capacitor A in the memory cell of FIG. 18 for a logical "one" or logical "zero" during the leakage, read, or write period.

FIG. 19 is a graph of a voltage at capacitor A in the memory cell 201 of FIG. 18 for a logical "one" or "zero" during the leakage, read, or write period. The capacitor A is read and refreshed in a similar manner as described in FIG. 16.

Figure 20:
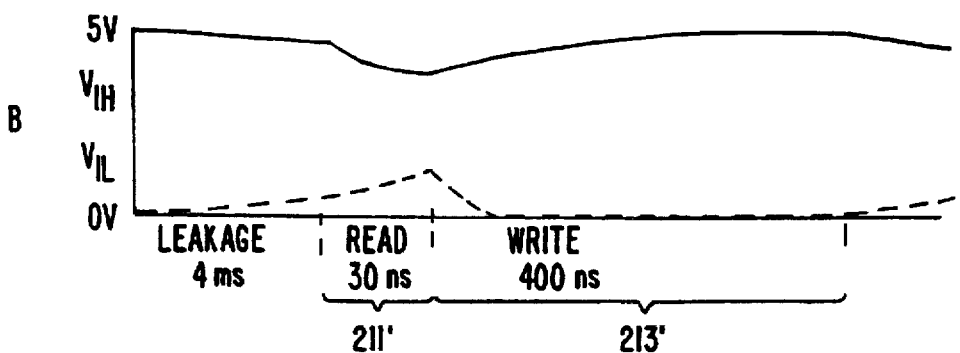
FIG. 20 is a graph showing the voltage at capacitor B of the memory cell of FIG. 18 for a logical "one" or logical "zero" during the leakage, read, and write period.

FIG. 20 is a graph showing the voltage at capacitor B of the memory cell 201 of FIG. 18 for a logical "one" or logical "zero" during the leakage, read, and write period. Notice that the leaky diode prevents the voltage at capacitor B from rising above the voltage $V_{IL}$ for the logical "zero" case and prevents the voltage at capacitor B from falling below the voltage $V_{IH}$ for the logical "one" case. Notice that in the write period 213', voltage at capacitor B in the logical "zero" case reaches zero volts quicker than the voltage at capacitor B reaches five volts in the logical "one" case. The use of a diode 199 compensates for an asymmetrical process in which a write back of a logical "zero" would otherwise take more time. A diode facing the other direction can be used to compensate for an asymmetrical process in which a write back of a logical "one" takes more time.

Figure 21:
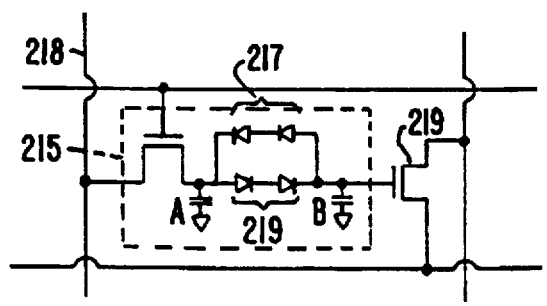
FIG. 21 is still yet another embodiment of the present invention showing a memory cell with a capacitor A separated from capacitor B by two sets of diodes biased in opposite directions.

FIG. 21 is still yet another embodiment of the present invention showing a memory cell 215 with a capacitor A separated from a capacitor B by two sets of diodes biased in opposite directions, set 217 and set 219. The use of two sets of diodes allows for the voltage at capacitor B to be isolated from the precharge voltage on column line 218 during the read period.

Figure 22:
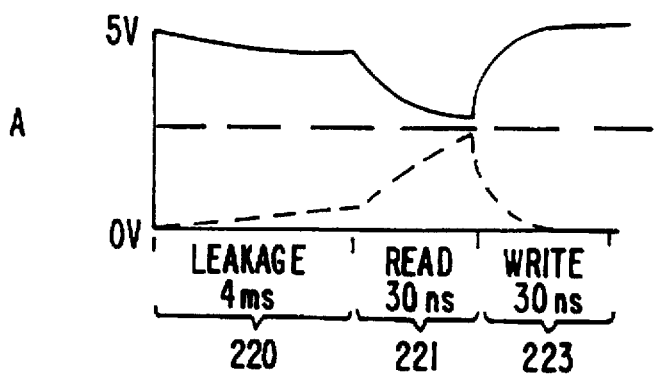
FIG. 22 is a graph of the voltage at capacitor A of the memory cell of FIG. 21 for a logical "one" or logical "zero" during the leakage, read, or write period.

FIG. 22 is a graph of the voltage at capacitor A of the memory cell 215 of FIG. 21 for a logical "one" or a logical "zero" during the leakage, read or write period. Note that the voltage of the capacitor A can be isolated from the switch 219 by the series of diodes 217 and 219.

Figure 23:
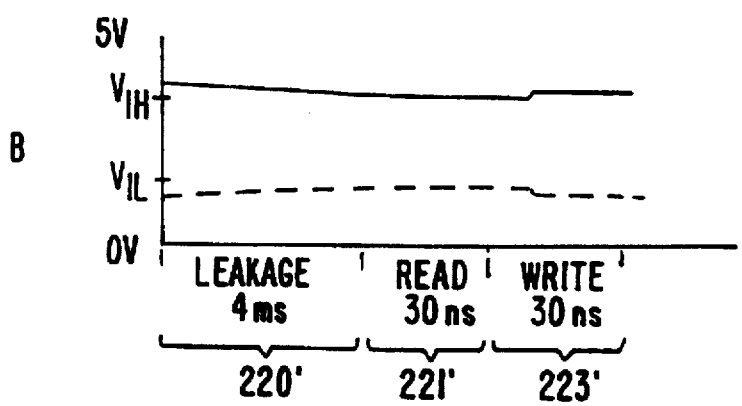
FIG. 23 is a graph of the voltage at capacitor B for memory cell of FIG. 21 for a logical "one" or logical "zero" during the leakage, read, or write period.

FIG. 23 is a graph of the voltage at capacitor B for the memory cell 215 of FIG. 21 for a logical "one" or a logical "zero" during the leakage, read or write period. For the logical "one" case at the beginning of the leakage period 220' the voltage on the line 218 would be charged up to 5 volts to write back the voltage value into the memory cell 219. The voltage on capacitor A is charged up to 5 volts and since the voltage at capacitor B is separated by two diode voltage drops from capacitor A, the voltage at capacitor B will be 3.8 volts, (5 v– 1.2 v=3.8 v, where 1.2 v is the voltage drop through two diodes).

During the leakage period 220', the voltage at capacitor B may drop to, for example, 3.6 volts which is still above $V_{IH}$ which is illustratively 3.5 volts. During the read period 221' the column line 218 is precharged up to 2.5 volts. This is less than 2.6 volts but since 3.6 volts minus 2.5 volts is equal to 1.1 volts which is less than the 1.2 volts necessary to turn on the diode row 217, the voltage on capacitor B during the read period 221' does not change. During the write period the voltage at capacitor B is quickly written back to 3.8 volts when the voltage on capacitor A reaches 5 volts.

Conversely, for the logical "zero" case, in the beginning of the leakage period at 220' the voltage is at 1.2 volts. At the end of the leakage period 220' the voltage at capacitor B is 1.4 volts. 1.4 volts is below the voltage $V_{IL}$, illustratively 1.5 volts. When the column line 218 is precharged to 2.5 volts, the voltage at capacitor B is not affected. When the value at capacitor A written back to zero volts in the write period at 223', the voltage of capacitor B drops down to 1.2 volts. Note that during the read periods the voltage at capacitor B is not affected by the precharge voltage on the column line 218.

Figure 24:
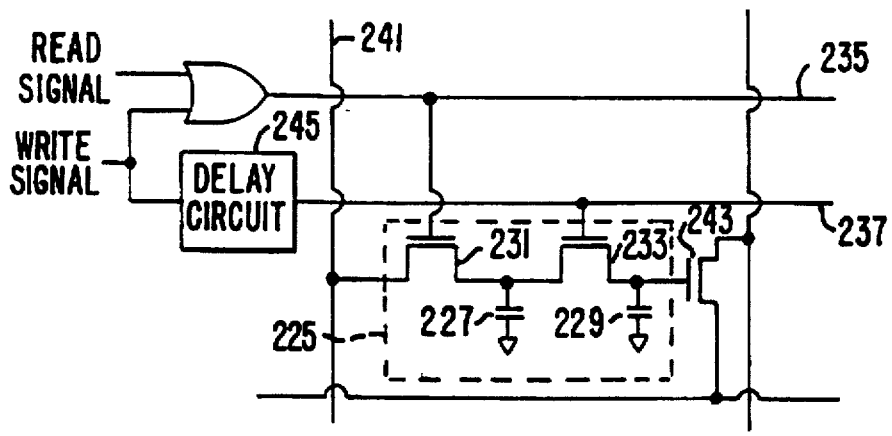
FIG. 24 is a schematic view of an embodiment of the present invention showing a memory cell having two capacitors and two transistors.

FIG. 24 is a schematic view of an embodiment of the present invention showing memory cell 225 having two capacitors 227 and 229 and two transistors 231 and 233. Access transistor 231 is turned on by a voltage on the row line 235. Access transistor 233 is turned on by a voltage on row 237. The access transistor 233 is not turned on during a read of capacitor 227. In a write to the memory cell 225, the access transistor 231 is turned on first so that the voltage on column line 241 is placed into capacitor 227. After a delay period, access transistor 233 is turned on to write back the voltage value into capacitor 229. In this manner, the switch 243 is always be maintained in the correct state. The write signal is sent to a delay circuit 245 connected to row line 237.

A benefit of the memory cell 225 is that the access transistor 233 isolates capacitor 229 from the precharge voltage during the read cycle. In the write period, access transistor 231 is turned on before access transistor 233 so that the voltage value in the capacitor 227 directly after the read period does not reach capacitor 229, In this way, transistor 243 is not inadvertently switched.

Figure 25:
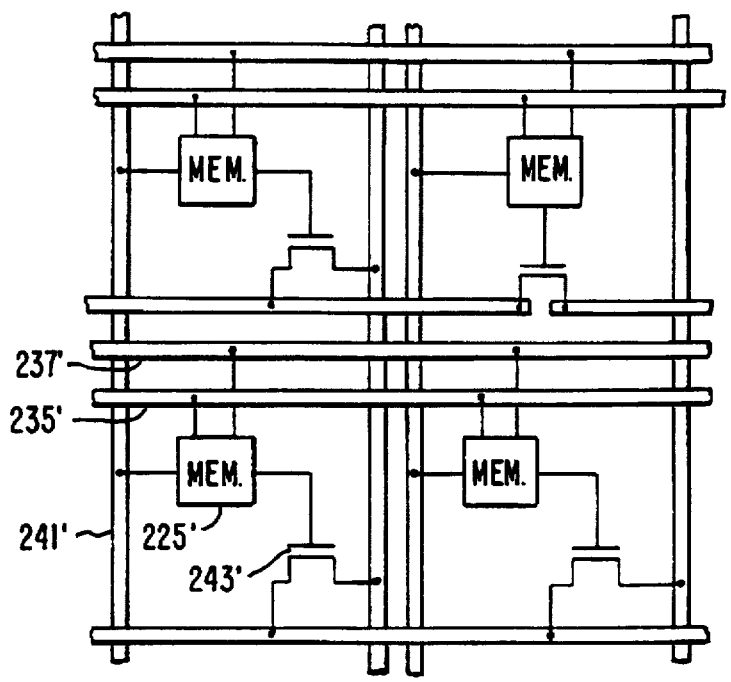
FIG. 25 is a schematic view showing the metallization layers used for the memory cell of FIG. 24.

A disadvantage of the embodiment of FIG. 24 can be seen in FIG. 25. FIG. 25 is a schematic view showing the metallization layers used for the memory cell of FIG. 24. Note that since two row lines 235' and 237' are required, the required silicon area of each memory and switch combination is expanded. This is especially true because current DRAM process are metallization layer limited. FIG. 25 can be related back to the random access memory section 11 and cross point switches section 60 of FIG. 1 with the modification that an additional row line is required for each switching cell which is the memory cell and switch combination.

Figure 26:
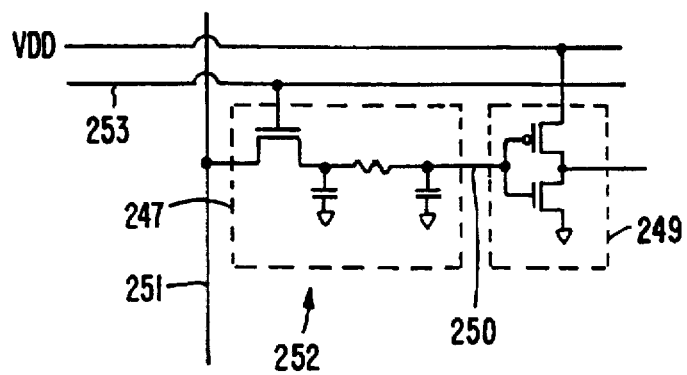
FIG. 26 is a schematic view showing a memory cell of the present invention connected to a buffer.

FIG. 26 is a schematic view showing a memory cell 247 of the present invention connected to a driving element 249. The figure shows a driving cell 252 comprised of the driving element 249, dedicated connection 250 and memory cell 247. The driving element 249 is shown as an inverter but driving element 249 may be, for example, a non-inverting buffer which is in a typical embodiment two inverters connected together. The driving element 249 and memory cell 247 are connected by a dedicated connection 250. Column line 251 and row line 253 can be used to write memory into the memory cell 247 in the same manner as that described with respect to FIG. 15. Any of the memory cells described herein can be used for memory cell 247 of FIG. 26. The state information stored in memory cell 247 can be used to set the value of the driving element 249. The driving element 249 can be connected to configurable logic blocks in a manner such as that described with respect to FIG. 3.

Visibility and Observability Lines

Figure 27:
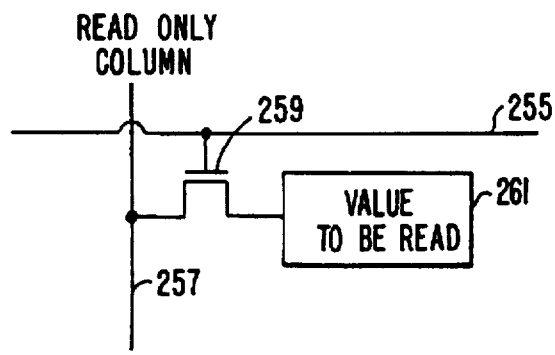
FIG. 27 is a schematic view of one bit of an observability line.

FIG. 27 is a schematic view of one bit of an observability line. A row line 255 and read only column line 257 are connected to access transistor 259. When the voltage on row 255 is high the read only column line 257 can determine the value of node 261 of a circuit emulated in the FPGA chip. This bit of the observability line may be in portion 74 connected to row decoder 13 and column decoder 21 shown in FIG. 1.

Looking at FIG. 27, since column 257 and row 255 can be connected to a row and column decoder, the value of node 261 can be easily read out through the read only column 257.

Figure 28:
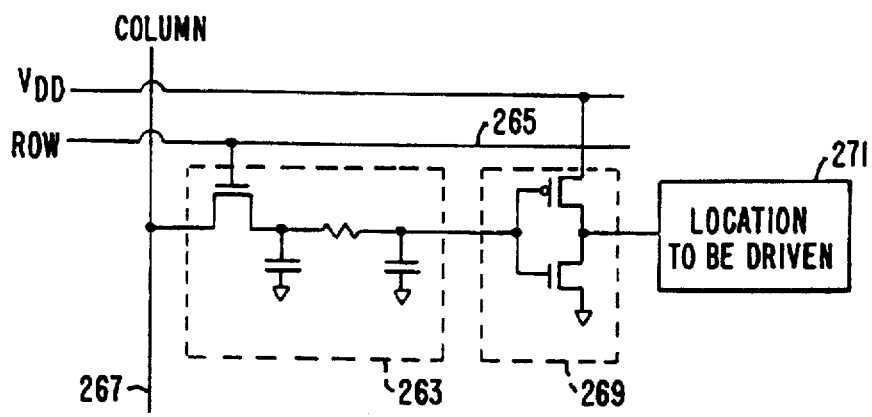
FIG. 28 is a schematic view of one bit of the controllability line.

FIG. 28 is a schematic view of one bit of a controllability line. A memory cell 263 accessed with a row line 265 and column line 267 can be used to store a state of the driving element 269. The memory cell 263 can be any of the types of memory cells shown above. The value of the capacitors in the memory cell 263 can be refreshed in the manner described above. The driving element 269 is shown as an invertor but may be for example, a non-inverting buffer. The location to be driven 271 is a node such as a reset or a set on a flip-flop. The row line 265 and column line and 267 can be connected to the row decoder 13 and column decoder 21 in the controllability portion 76 shown in FIG. 1. FIG. 4 shows a memory cell 2 and driving element 5 used in this fashion to clear a flip-flop 98. Since the state of the flip-flops can be set using the controllability bits the testing of the emulated circuit placed on the FPGA can be more efficient since it is easy to set a specific node in the emulated circuit using the controllability line.

Figure 29:
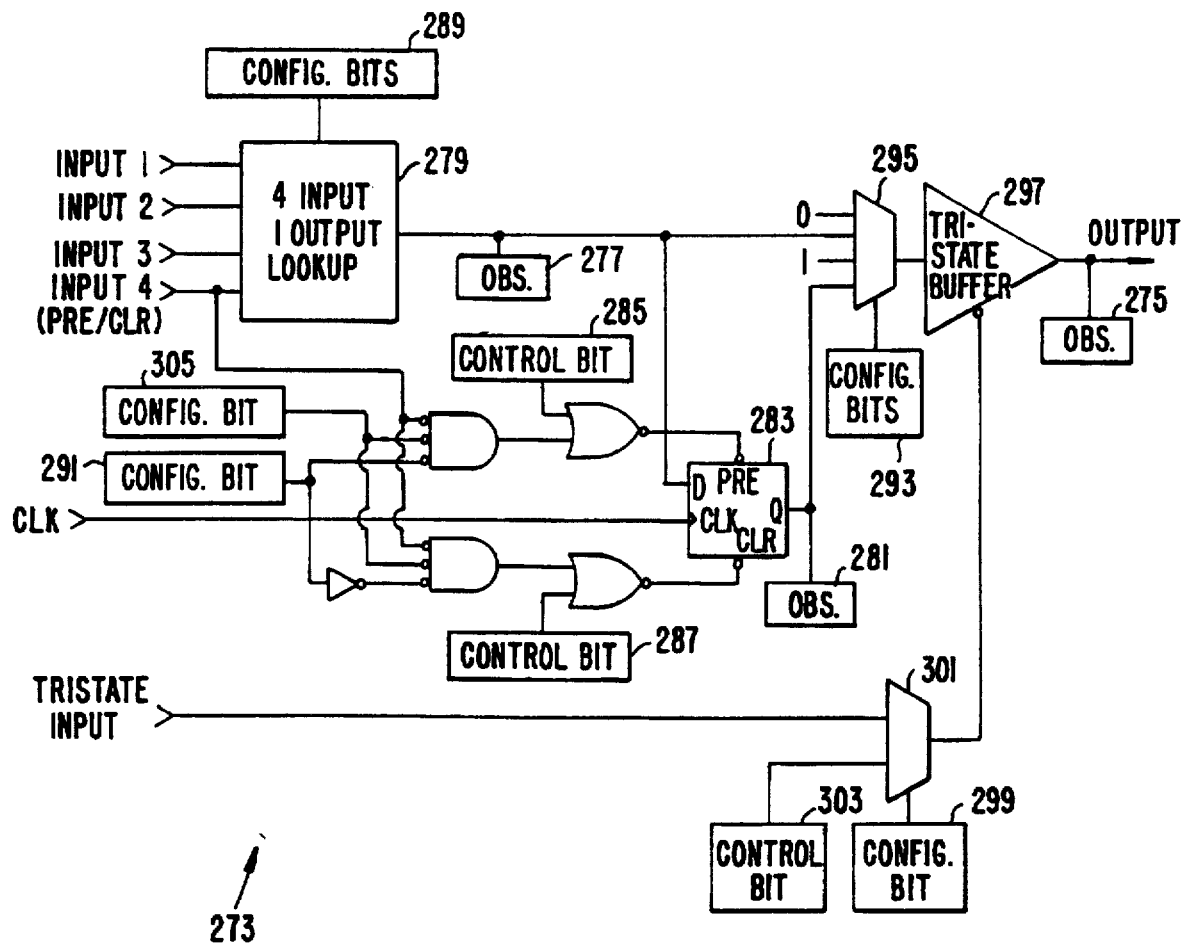
FIG. 29 is a schematic diagram of a logic unit that includes a flip-flop as well as observability and controllability features.

FIG. 29 is a schematic view of a preferred embodiment of a configurable logic block 273 of the present invention. This figure illustrates the benefit of using controllability and observability lines. Observability bit 275 can observe the output state of the configurable logic block 273. Observability bit 277 can observe the output of the four input; one-output lookup table 279. Observability bit 281 can observe the Q output of D type flip-flop 283. Controllability bit 285 can set the PRE input of flip-flop 283 and controllability bit 287 can set the CLR input of flip-flop 283. Controllability bit 303 can be used to set the tri-state buffer 297 in a high impedance mode. The use of these controllability and observability bits is especially beneficial for emulation applications.

The topography of the configurable logic block 273 is set by the configuration bits. These configuration bits can be memory cell and driving element combinations like that shown in FIG. 26. Looking again at FIG. 29, configuration bits 289 comprising sixteen configuration bits set the configuration of the lookup table 279. Configuration bit 291 determines whether the PRE/CLR input is sent to the PRE input or CLR input of D type flip-flop 283. Configuration bit 305 determines whether the PRE/CLR input is disabled. Configuration bits 293 determine whether the four input multiplexer 295 passes the Q output of flip-flop 283, the output of the lookup table 279, a logical "one" or a logical "zero" to the input of the tri-state buffer 297. The configuration bit 299 determines whether the two state multiplexer 301 passes the value of controllability bit 303 or the tri-state buffer input to the tri-state buffer 297 to control whether the tri-state buffer 297 is in high impedance mode.

A portion of the circuit of FIG. 29 is shown implemented in FIG. 4. Configuration bit 291 of FIG. 29 corresponds to memory cell 1 and inverter 4 of FIG. 4. Controllability bit 285 of FIG. 29 corresponds to memory cell 3 and buffer 6 of FIG. 4. Controllability bit 287 of FIG. 29 corresponds to memory cell 2 and buffer 5 of FIG. 4. Observability bit 281 of FIG. 29 corresponds to transistor 99 of FIG. 4.

Note that the memory cell 111 of FIG. 8 could not be used in the configuration bit 291 or control bits 285 or 287 of FIG. 29 since these bits are connected to asynchronous inputs of the flip-flop 283. In addition, the state of the PRE/CLR input and CLK input of the configurable logic block 273 would have to be maintained during refreshes of the interconnect switching cells if these switching cells use the memory cell 111 of FIG. 8.

Various details of the implementation and method are merely illustrative of the invention. It is to be understood that various changes and in such details may be within the scope of the invention, which is to be limited only by the appended claims.

It is claimed:

1. An integrated circuit selectively interconnecting two signal lines, comprising:
   a switching cell formed at the intersection of the two signal lines and including:
   a memory cell of the type having state information implemented by storing electric charge that is inherently lost over time, said memory cell connected to no more than two conducting lines through which state information is communicated to and from said memory cell;

a switch connected between said two signal lines in a manner to provide a conductive path therebetween; and a connection circuit between the memory cell and the switch, wherein said switch is controlled in accordance with the state information of the memory cell; and refreshing means operably connected with said memory cell through said two conducting lines for reading the charge level of the memory cell and rewriting charge thereinto representative of its said state.

2. The circuit according to claim 1 wherein said memory cell includes means for maintaining the state information during a reading of said memory cell.

3. The circuit according to claim 2 wherein said maintaining means comprises a capacitive element having sufficient capacitance such that when said element is read by said refreshing means, the state information remains stored in said memory cell.

4. The circuit according to claim 2 wherein said maintaining means comprises a resistive element.

5. The circuit according to claim 4 wherein said maintaining means further comprises a capacitive element.

6. The circuit according to claim 1 wherein said memory cell includes a diode element.

7. An integrated circuit comprising a configurable circuit including an array of configurable units and a plurality of signal lines; and an array of memory cells, each memory cell directly coupled to a node in said configurable circuit and connected to no more than three conducting lines by which bit information is communicated to and from said memory cell, said memory cell holding electric charge representative of a single bit of information and placing said node in one logic state or another to define operation of said configurable circuit.

8. The integrated circuit according to claim 7 wherein said memory cell comprises an MOS transistor having a gate and first and second source/drains, said gate and said first source/drain respectively connected to one of said conducting lines; and a first capacitive element coupled to said MOS transistor and said node to closely couple said node to said memory cell, said first capacitive element holding said single bit of information.

9. The integrated circuit according to claim 8 wherein said node comprises a control terminal of a switch connected between a pair of two signal lines to provide a conductive path therebetween responsive to said bit information stored in said first capacitive element to condition said configurable circuit.

10. The integrated circuit according to claim 9 wherein said node comprises a gate of an MOS transistor, said MOS transistor having a pair of source/drains, each source/drain respectively connected to one of said signal lines.

11. The integrated circuit according to claim 8 wherein said node comprises an input terminal of a buffer circuit, said buffer circuit having an output terminal.

12. The integrated circuit according to claim 11 wherein said buffer circuit comprises an inverter.

13. The integrated circuit according to claim 8 wherein said first capacitive element having sufficient capacitance such that when said element is read, said bit information remains stored in said memory cell.

14. The integrated circuit according to claim 8 wherein said memory cell further comprises means for maintaining said bit information during a reading of said memory cell.

15. The integrated circuit according to claim 14 wherein said maintaining means comprises a resistive element connected between said second source/drain of said MOS transistor and said first capacitive element.

16. The integrated circuit according to claim 14 wherein said maintaining means comprises a resistive element connected between said first source/drain of said MOS transistor and one of said signal lines.

17. The integrated circuit according to claim 14 wherein said maintaining means comprises a second capacitive element and a resistive element, said second source/drain of said MOS transistor connected to said second capacitive element through said resistive element.

18. The integrated circuit according to claim 17 wherein said maintaining means comprises a diode element connected in parallel with said resistive element between said first and second capacitive elements.

19. The integrated circuit according to claim 14 wherein said maintaining means comprises a second capacitive element and two parallel paths, said second source/drain of said MOS transistor connected to said second capacitive element through said two parallel paths, said parallel paths having diode elements therein.

20. The integrated circuit according to claim 19 wherein each parallel path has two serially connected diode elements, each diode element having a directionality defined by a positive and negative terminal of said diode element, said diode elements in each parallel path having the same directionality and opposite to the directionality of said diode elements in the other parallel path.

21. The integrated circuit according to claim 14 wherein each memory cell in said memory cell array is connected to a third conducting line, said third conducting line carrying the same signal as one of said two conducting lines, and wherein said maintaining means comprises a second MOS transistor and a second capacitive element, said second MOS transistor having a gate and first and second source/drains, said gate connected to said third conducting line, said first source/drain connected to said second source/drain of said first MOS transistor, and said second source/drain of said second MOS transistor connected to said second capacitive element and said node.

22. The integrated circuit according to claim 21 wherein said third conducting line carries the signal on one of said two conducting lines in a delayed fashion.

23. The integrated circuit according to claim 7 wherein said configurable circuit comprises logic blocks including a plurality of flip-flops, each flip-flop having a system clock input and at least one node connected to a memory cell for defining operation of a signal path between flip-flips responsive to the bit information of said memory cell;

a system clock generating circuit adapted to supply a system clock input to said flip-flops; and wherein said maintaining means comprises a refreshing circuit operably connected with each memory cell through said two conducting lines for reading the charge level of the memory cell and rewriting charge thereinto representative of its bit information;

an interlock circuit connected to said refreshing circuit and connected to said system clock supplying circuit, said interlock circuit adapted to ensure that said refreshing circuit does not refresh said memory cells in a manner that causes one of said flip-flops to input the wrong data on a system clock input.

24. The integrated circuit according to claim 23 wherein said interlock circuit ensures that, after a refresh of said memory cell, any system clock trigger event occurs after the longest signal delay between flip-flops.

25. The integrated circuit according to claim 7 wherein said configurable circuit comprises an array of logic blocks, at least one logic block comprising a multiplexer having a plurality of input terminals, each input terminal connected to one of said memory cells, at least one control terminal connected to one of said signal lines, and an output terminal whereby said multiplexer selectively places bit information of one of said memory cells connected to said input terminals on said output terminal responsive to signals on said at least one control terminal.

26. The integrated circuit according to claim 25 further comprising a switch having a control terminal and first and second signal terminals, said first signal terminal connected to said multiplexer output terminal, said second signal terminal and said control terminal connected to two conducting lines respectively, whereby bit information on said multiplexer output terminal is monitored responsive to signals on control terminal.

27. The integrated circuit according to claim 26 wherein said switch comprises an MOS transistor.

28. The integrated circuit according to claim 26 wherein at least one of said conducting lines is further connected to said array of memory cells.

29. The integrated circuit according to claim 25 wherein said multiplexer has four input terminals and two control terminals, each input terminal connected to one of four memory cells and each control terminal connected to one of two signal lines.

30. The integrated circuit according to claim 29 wherein each of said input terminal is connected to one of four memory cells through a buffer circuit.

31. The integrated circuit according to claim 7 wherein said configurable circuit comprises an array of logic blocks, at least one logic block comprising a flip-flop circuit having a data input terminal, a data output terminal, and a clock input terminal, each of said terminals connected to one of said signal lines, said flip-flop circuit further having at least one control terminal, said at least one control terminal connected to a plurality of memory cells through a plurality of logic gates whereby bit information of said plurality of memory cells control operation of said flip-flop circuit.

32. The integrated circuit according to claim 31 wherein said flip-flop circuit has a preset control terminal and a clear control terminal, said control terminals connected to three memory cells through a plurality of logic gates.

33. The integrated circuit according to claim 31 further comprising a switch having a control terminal and first and second signal terminals, said first signal terminal connected to said flip-flop output terminal, said second signal terminal and said control terminal connected to two conducting lines respectively, whereby bit information on said flip-flop output terminal is monitored responsive to signals on said control terminal.

34. The integrated circuit according to claim 33 wherein said switch comprises an MOS transistor.

35. The integrated circuit according to claim 33 wherein at least one of said conducting lines is further connected to said array of memory cells.

36. The integrated circuit according to claim 31 wherein said at least one control terminal is connected to an output terminal of a logic gate, said logic gate having an input terminal connected to a memory cell whereby said flip-flop circuit is set by bit information in said memory cell.

37. The integrated circuit according to claim 36 wherein said flip-flop circuit has two control terminals, each control terminal connected to an output terminal of a logic gate, said logic gate having an input terminal connected to a memory cell whereby said flip-flop circuit is set by bit information in said memory cell.

38. The integrated circuit according to claim 37 wherein said two control terminals comprise a preset control terminal and a clear control terminal.

39. The integrated circuit according to claim 37 wherein each of said memory cells is commonly connected to a conducting line.

40. The integrated circuit according to claim 7 wherein said configurable circuit comprises an array of logic blocks, at least one logic block comprising an input/output circuit having a plurality of interconnected logic gates, said logic gates having input and output terminals connected to a first signal line for receiving data signals from other portions of said configurable circuit, a second signal line for generating data signals to other portions of said configurable circuit, a third signal line connected to an integrated circuit pad, and a fourth signal line for receiving control signals indicative of a transfer of data signals from said integrated circuit pad to said second signal line or of a transfer of data signals from said first signal line to said integrated circuit pad, said logic gates further having input terminals connected to a plurality of memory cells whereby bit information of said plurality of memory cells control operation of said input/output circuit.

41. The integrated circuit according to claim 40 further comprising a switch having a control terminal and first and second signal terminals, said first signal terminal connected to one of said signal lines, said second signal terminal and said control terminal connected to two conducting lines respectively, whereby bit information on said one of said signal lines is monitored responsive to signals on said control terminal.

42. The integrated circuit according to claim 41 wherein said switch comprises an MOS transistor.

43. The integrated circuit according to claim 41 further comprising four of said switches, each switch respectively having a first signal terminal connected to one of said signal lines.

44. The integrated circuit according to claim 41 wherein at least one of said conducting lines is further connected to said array of memory cells.

45. The integrated circuit according to claim 41 wherein both of said conducting lines are further connected to said array of memory cells.

46. The integrated circuit according to claim 40 wherein said logic gates comprise a multiplexer having first and second input terminals and an output terminal, said first input terminal connected to a first node in said input/output circuit and said second input terminal connected to a memory cell, said output terminal connected to second node in said input/output circuit whereby said multiplexer can select bit information in said memory cell in place of a signal from said first node to said second node to control operation of said input/output circuit.

47. The integrated circuit according to claim 46 wherein said multiplexer has a control terminal connected to a second memory cell whereby said multiplexer operates in response to bit information in said second memory cell.

48. The integrated circuit according to claim 46 wherein said first input terminal of said multiplexer is connected to an output terminal of a first logic gate having an input terminal connected to said first signal line, and said output terminal of said multiplexer connected to an input terminal of a second logic gate having an output terminal connected to said third signal line.

49. The integrated circuit according to claim 46 wherein said first input terminal of said multiplexer is connected to said fourth signal line, and said output terminal of said multiplexer connected to a control terminal of a second logic gate having an output terminal connected to said third signal line whereby said second logic gate is enabled or disabled responsive to a signal on said control terminal.

50. The integrated circuit according to claim 46 wherein said first input terminal of said multiplexer is connected to an output terminal of a first logic gate having an input terminal connected to said third signal line, and said output terminal of said multiplexer connected to said second signal line.

51. An integrated circuit comprising
a configurable circuit including an array of configurable units and a plurality of signal lines; and
an array of memory cells, each memory cell directly coupled to a node in said configurable circuit and connected to no more than two conducting lines by which bit information is communicated to and from said memory cell, said memory cell holding electric charge representative of a single bit of information corresponding to one logic state or another at said node to define operation of said configurable circuit.

52. The integrated circuit according to claim 51 wherein said memory cell comprises
an MOS transistor having a gate and first and second source/drains, said gate and said first source/drain respectively connected to one of said conducting lines; and
a first capacitive element coupled to said MOS transistor and said node to closely couple said node to said memory cell, said first capacitive element holding said single bit of information.

53. The integrated circuit according to claim 52 wherein said node comprises a control terminal of a switch connected between a pair of two signal lines to provide a conductive path therebetween responsive to said bit information stored in said first capacitive element to condition said configurable circuit.

54. The integrated circuit according to claim 53 wherein said node comprises a gate of an MOS transistor, said MOS transistor having a pair of source/drains, each source/drain respectively connected to one of said signal lines.

55. The integrated circuit according to claim 52 wherein said node comprises an input terminal of a buffer circuit, said buffer circuit having an output terminal.

56. The integrated circuit according to claim 55 wherein said buffer circuit comprises an inverter.

57. The integrated circuit according to claim 52 wherein said first capacitive element having sufficient capacitance such that when said element is read, said bit information remains stored in said memory cell.

58. The integrated circuit according to claim 52 wherein said memory cell further comprises means for maintaining said bit information during a reading of said memory cell.

59. The integrated circuit according to claim 58 wherein said maintaining means comprises a resistive element connected between said second source/drain of said MOS transistor and said first capacitive element.

60. The integrated circuit according to claim 58 wherein said maintaining means comprises a resistive element connected between said first source/drain of said MOS transistor and one of said signal lines.

61. The integrated circuit according to claim 58 wherein said maintaining means comprises a second capacitive element and a resistive element, said second source/drain of said MOS transistor connected to said second capacitive element through said resistive element.

62. The integrated circuit according to claim 61 wherein said maintaining means comprises a diode element connected in parallel with said resistive element between said first and second capacitive elements.

63. The integrated circuit according to claim 58 wherein said maintaining means comprises a second capacitive element and two parallel paths, said second source/drain of said MOS transistor connected to said second capacitive element through said two parallel paths, said parallel paths having diode elements therein.

64. The integrated circuit according to claim 63 wherein each parallel path has two serially connected diode elements, each diode element having a directionality defined by a positive and negative terminal of said diode element, said diode elements in each parallel path having the same directionality and opposite to the directionality of said diode elements in the other parallel path.

65. The integrated circuit according to claim 58 wherein each memory cell in said memory cell array is connected to a third conducting line, said third conducting line carrying the same signal as one of said two conducting lines, and wherein said maintaining means comprises a second MOS transistor and a second capacitive element, said second MOS transistor having a gate and first and second source/drains, said gate connected to said third conducting line, said first source/drain connected to said second source/drain of said first MOS transistor, and said second source/drain of said second MOS transistor connected to said second capacitive element and said node.

66. The integrated circuit according to claim 65 wherein said third conducting line carries the signal on one of said two conducting lines in a delayed fashion.

67. The integrated circuit according to claim 51 wherein said configurable circuit comprises
logic blocks including a plurality of flip-flops, each flip-flop having a system clock input and at least one node connected to a memory cell for defining operation of a signal path between flip-flips responsive to the bit information of said memory cell;
a system clock generating circuit adapted to supply a system clock input to said flip-flops; and
wherein said maintaining means comprises
a refreshing circuit operably connected with each memory cell through said two conducting lines for reading the charge level of the memory cell and rewriting charge thereinto representative of its bit information;
an interlock circuit connected to said refreshing circuit and connected to said system clock supplying circuit, said interlock circuit adapted to ensure that said refreshing circuit does not refresh said memory cells in a manner that causes one of said flip-flops to input the wrong data on a system clock input.

68. The integrated circuit according to claim 67 wherein said interlock circuit ensures that, after a refresh of said memory cell, any system clock trigger event occurs after the longest signal delay between flip-flops.

69. The integrated circuit according to claim 51 wherein said configurable circuit comprises an array of logic blocks, at least one logic block comprising a multiplexer having a plurality of input terminals, each input terminal connected to one of said memory cells, at least one control terminal connected to one of said signal lines, and an output terminal whereby said multiplexer selectively places bit information of one of said memory cells connected to said input terminals on said output terminal responsive to signals on said at least one control terminal.

70. The integrated circuit according to claim 69 further comprising a switch having a control terminal and first and second signal terminals, said first signal terminal connected to said multiplexer output terminal, said second signal terminal and said control terminal connected to two conducting lines respectively, whereby bit information on said multiplexer output terminal is monitored responsive to signals on control terminal.

71. The integrated circuit according to claim 70 wherein said switch comprises an MOS transistor.

72. The integrated circuit according to claim 70 wherein at least one of said conducting lines is further connected to said array of memory cells.

73. The integrated circuit according to claim 69 wherein said multiplexer has four input terminals and two control terminals, each input terminal connected to one of four memory cells and each control terminal connected to one of two signal lines.

74. The integrated circuit according to claim 73 wherein each of said input terminal is connected to one of four memory cells through a buffer circuit.

75. The integrated circuit according to claim 51 wherein said configurable circuit comprises an array of logic blocks, at least one logic block comprising a flip-flop circuit having a data input terminal, a data output terminal, and a clock input terminal, each of said terminals connected to one of said signal lines, said flip-flop circuit further having at least one control terminal, said at least one control terminal connected to a plurality of memory cells through a plurality of logic gates whereby bit information of said plurality of memory cells control operation of said flip-flop circuit.

76. The integrated circuit according to claim 75 wherein said flip-flop circuit has a preset control terminal and a clear control terminal, said control terminals connected to three memory cells through a plurality of logic gates.

77. The integrated circuit according to claim 76 further comprising a switch having a control terminal and first and second signal terminals, said first signal terminal connected to said flip-flop output terminal, said second signal terminal and said control terminal connected to two conducting lines respectively, whereby bit information on said flip-flop output terminal is monitored responsive to signals on said control terminal.

78. The integrated circuit according to claim 77 wherein said switch comprises an MOS transistor.

79. The integrated circuit according to claim 77 wherein at least one of said conducting lines is further connected to said array of memory cells.

80. The integrated circuit according to claim 75 wherein said at least one control terminal is connected to an output terminal of a logic gate, said logic gate having an input terminal connected to a memory cell whereby said flip-flop circuit is set by bit information in said memory cell.

81. The integrated circuit according to claim 80 wherein said flip-flop circuit has two control terminals, each control terminal connected to an output terminal of a logic gate, said logic gate having an input terminal connected to a memory cell whereby said flip-flop circuit is set by bit information in said memory cell.

82. The integrated circuit according to claim 81 wherein said two control terminals comprise a preset control terminal and a clear control terminal.

83. The integrated circuit according to claim 81 wherein each of said memory cells is commonly connected to a conducting line.

84. The integrated circuit according to claim 51 wherein said configurable circuit comprises an array of logic blocks, at least one logic block comprising an input/output circuit having a plurality of interconnected logic gates, said logic gates having input and output terminals connected to a first signal line for receiving data signals from other portions of said configurable circuit, a second signal line for generating data signals to other portions of said configurable circuit, a third signal line connected to an integrated circuit pad, and a fourth signal line for receiving control signals indicative of a transfer of data signals from said integrated circuit pad to said second signal line or of a transfer of data signals from said first signal line to said integrated circuit pad, said logic gates further having input terminals connected to a plurality of memory cells whereby bit information of said plurality of memory cells control operation of said input/output circuit.

85. The integrated circuit according to claim 84 further comprising a switch having a control terminal and first and second signal terminals, said first signal terminal connected to one of said signal lines, said second signal terminal and said control terminal connected to two conducting lines respectively, whereby bit information on said one of said signal lines is monitored responsive to signals on said control terminal.

86. The integrated circuit according to claim 85 wherein said switch comprises an MOS transistor.

87. The integrated circuit according to claim 85 further comprising four of said switches, each switch respectively having a first signal terminal connected to one of said signal lines.

88. The integrated circuit according to claim 85 wherein at least one of said conducting lines is further connected to said array of memory cells.

89. The integrated circuit according to claim 85 wherein both of said conducting lines are further connected to said array of memory cells.

90. The integrated circuit according to claim 84 wherein said logic gates comprise a multiplexer having first and second input terminals and an output terminal, said first input terminal connected to a first node in said input/output circuit and said second input terminal connected to a memory cell, said output terminal connected to second node in said input/output circuit whereby said multiplexer can select bit information in said memory cell in place of a signal from said first node to said second node to control operation of said input/output circuit.

91. The integrated circuit according to claim 90 wherein said multiplexer has a control terminal connected to a second memory cell whereby said multiplexer operates in response to bit information in said second memory cell.

92. The integrated circuit according to claim 90 wherein said first input terminal of said multiplexer is connected to an output terminal of a first logic gate having an input terminal connected to said first signal line, and said output terminal of said multiplexer connected to an input terminal of a second logic gate having an output terminal connected to said third signal line.

93. The integrated circuit according to claim 90 wherein said first input terminal of said multiplexer is connected to said fourth signal line, and said output terminal of said multiplexer connected to a control terminal of a second logic gate having an output terminal connected to said third signal line whereby said second logic gate is enabled or disabled responsive to a signal on said control terminal.

94. The integrated circuit according to claim 90 wherein said first input terminal of said multiplexer is connected to an output terminal of a first logic gate having an input terminal connected to said third signal line, and said output terminal of said multiplexer connected to said second signal line.

95. An integrated circuit comprising
a configurable circuit including an array of configurable units and a plurality of signal lines; and
an array of memory cells and a plurality of conducting lines, one set of conducting lines generally aligned in a first direction and a second set of conducting lines generally aligned in a second direction perpendicular to said first direction, each memory cell connected to a node in said configurable circuit by logic only and no more than three of said conducting lines, one from each set of perpendicular conducting lines, by which bit information is communicated to and from said memory cell so that each memory cell is capable of being randomly addressed by said two conducting lines, said memory cell holding electric charge representative of a single bit of information placing said node in one logic state or another to define operation of said configurable circuit;
whereby operation of said configurable circuit is capable of being differently defined by a selective address of one memory cell without addressing other memory cells.

96. The integrated circuit according to claim 95 wherein said memory cell comprises
an MOS transistor having a gate and first and second source/drains, said gate and said first source/drain respectively connected to one of said conducting lines; and
a first capacitive element connected to said second source/drain of said MOS transistor and said node to closely couple said node to said configurable circuit, said first capacitive element holding said single bit of information.

97. The integrated circuit according to claim 96 wherein said node comprises a control terminal of a switch connected between a pair of two signal lines to provide a conductive path therebetween responsive to said bit information stored in said first capacitive element to condition said configurable circuit.

98. The integrated circuit according to claim 97 wherein said node comprises a gate of an MOS transistor, said MOS transistor having a pair of source/drains, each source/drain respectively connected to one of said signal lines.

99. The integrated circuit according to claim 96 wherein said node comprises an input terminal of a buffer circuit, said buffer circuit having an output terminal.

100. The integrated circuit according to claim 99 wherein said buffer circuit comprises an inverter.

101. The integrated circuit according to claim 96 wherein said first capacitive element having sufficient capacitance such that when said element is read, said bit information remains stored in said memory cell.

102. The integrated circuit according to claim 96 wherein said memory cell further comprises means for maintaining said bit information during a reading of said memory cell.

103. The integrated circuit according to claim 102 wherein said maintaining means comprises a resistive element connected between said second source/drain of said MOS transistor and said first capacitive element.

104. The integrated circuit according to claim 102 wherein said maintaining means comprises a resistive element connected between said first source/drain of said MOS transistor and one of said signal lines.

105. The integrated circuit according to claim 102 wherein said maintaining means comprises a second capacitive element and a resistive element, said second source/drain of said MOS transistor connected to said second capacitive element through said resistive element.

106. The integrated circuit according to claim 105 wherein said maintaining means comprises a diode element connected in parallel with said resistive element between said first and second capacitive elements.

107. The integrated circuit according to claim 102 wherein said maintaining means comprises a second capacitive element and two parallel paths, said second source/drain of said MOS transistor connected to said second capacitive element through said two parallel paths, said parallel paths having diode elements therein.

108. The integrated circuit according to claim 107 wherein each parallel path has two serially connected diode elements, each diode element having a directionality defined by a positive and negative terminal of said diode element, said diode elements in each parallel path having the same directionality and opposite to the directionality of said diode elements in the other parallel path.

109. The integrated circuit according to claim 102 wherein each memory cell in said memory cell array is connected to a third conducting line, said third conducting line carrying the same signal as one of said two conducting lines, and wherein said maintaining means comprises a second MOS transistor and a second capacitive element, said second MOS transistor having a gate and first and second source/drains, said gate connected to said third conducting line, said first source/drain connected to said second source/drain of said first MOS transistor, and said second source/drain of said second MOS transistor connected to said second capacitive element and said node.

110. The integrated circuit according to claim 109 wherein said third conducting line carries the signal on one of said two conducting lines in a delayed fashion.

111. The integrated circuit according to claim 95 wherein said configurable circuit comprises
logic blocks including a plurality of flip-flops, each flip-flop having a system clock input and at least one node connected to a memory cell for defining operation of a signal path between flip-flips responsive to the bit information of said memory cell;
a system clock generating circuit adapted to supply a system clock input to said flip-flops; and
wherein said maintaining means comprises
a refreshing circuit operably connected with each memory cell through said two conducting lines for reading the charge level of the memory cell and rewriting charge thereinto representative of its bit information;
an interlock circuit connected to said refreshing circuit and connected to said system clock supplying circuit, said interlock circuit adapted to ensure that said refreshing circuit does not refresh said memory cells in a manner that causes one of said flip-flops to input the wrong data on a system clock input.

112. The integrated circuit according to claim 111 wherein said interlock circuit ensures that, after a refresh of said memory cell, any system clock trigger event occurs after the longest signal delay between flip-flops.

113. The integrated circuit according to claim 95 wherein said configurable circuit comprises an array of logic blocks, at least one logic block comprising a multiplexer having a plurality of input terminals, each input terminal connected to one of said memory cells, at least one control terminal connected to one of said signal lines, and an output terminal whereby said multiplexer selectively places bit information of one of said memory cells connected to said input terminals on said output terminal responsive to signals on said at least one control terminal.

114. The integrated circuit according to claim 113 further comprising a switch having a control terminal and first and second signal terminals, said first signal terminal connected to said multiplexer output terminal, said second signal terminal and said control terminal connected to two conducting lines respectively, whereby bit information on said multiplexer output terminal is monitored responsive to signals on control terminal.

115. The integrated circuit according to claim 114 wherein said switch comprises an MOS transistor.

116. The integrated circuit according to claim 114 wherein at least one of said conducting lines is further connected to said array of memory cells.

117. The integrated circuit according to claim 113 wherein said multiplexer has four input terminals and two control terminals, each input terminal connected to one of four memory cells and each control terminal connected to one of two signal lines.

118. The integrated circuit according to claim 117 wherein each of said input terminal is connected to one of four memory cells through a buffer circuit.

119. The integrated circuit according to claim 95 wherein said configurable circuit comprises an array of logic blocks, at least one logic block comprising a flip-flop circuit having a data input terminal, a data output terminal, and a clock input terminal, each of said terminals connected to one of said signal lines, said flip-flop circuit further having at least one control terminal, said at least one control terminal connected to a plurality of memory cells through a plurality of logic gates whereby bit information of said plurality of memory cells control operation of said flip-flop circuit.

120. The integrated circuit according to claim 119 wherein said flip-flop circuit has a preset control terminal and a clear control terminal, said control terminals connected to three memory cells through a plurality of logic gates.

121. The integrated circuit according to claim 119 further comprising a switch having a control terminal and first and second signal terminals, said first signal terminal connected to said flip-flop output terminal, said second signal terminal and said control terminal connected to two conducting lines respectively, whereby bit information on said flip-flop output terminal is monitored responsive to signals on said control terminal.

122. The integrated circuit according to claim 121 wherein said switch comprises an MOS transistor.

123. The integrated circuit according to claim 121 wherein at least one of said conducting lines is further connected to said array of memory cells.

124. The integrated circuit according to claim 119 wherein said at least one control terminal is connected to an output terminal of a logic gate, said logic gate having an input terminal connected to a memory cell whereby said flip-flop circuit is set by bit information in said memory cell.

125. The integrated circuit according to claim 124 wherein said flip-flop circuit has two control terminals, each control terminal connected to an output terminal of a logic gate, said logic gate having an input terminal connected to a memory cell whereby said flip-flop circuit is set by bit information in said memory cell.

126. The integrated circuit according to claim 125 wherein said two control terminals comprise a preset control terminal and a clear control terminal.

127. The integrated circuit according to claim 125 wherein each of said memory cells is commonly connected to a conducting line.

128. The integrated circuit according to claim 95 wherein said configurable circuit comprises an array of logic blocks, at least one logic block comprising an input/output circuit having a plurality of interconnected logic gates, said logic gates having input and output terminals connected to a first signal line for receiving data signals from other portions of said configurable circuit, a second signal line for generating data signals to other portions of said configurable circuit, a third signal line connected to an integrated circuit pad, and a fourth signal line for receiving control signals indicative of a transfer of data signals from said integrated circuit pad to said second signal line or of a transfer of data signals from said first signal line to said integrated circuit pad, said logic gates further having input terminals connected to a plurality of memory cells whereby bit information of said plurality of memory cells control operation of said input/output circuit.

129. The integrated circuit according to claim 128 further comprising a switch having a control terminal and first and second signal terminals, said first signal terminal connected to one of said signal lines, said second signal terminal and said control terminal connected to two conducting lines respectively, whereby bit information on said one of said signal lines is monitored responsive to signals on said control terminal.

130. The integrated circuit according to claim 129 wherein said switch comprises an MOS transistor.

131. The integrated circuit according to claim 129 further comprising four of said switches, each switch respectively having a first signal terminal connected to one of said signal lines.

132. The integrated circuit according to claim 129 wherein at least one of said conducting lines is further connected to said array of memory cells.

133. The integrated circuit according to claim 132 wherein both of said conducting lines are further connected to said array of memory cells.

134. The integrated circuit according to claim 128 wherein said logic gates comprise a multiplexer having first and second input terminals and an output terminal, said first input terminal connected to a first node in said input/output circuit and said second input terminal connected to a memory cell, said output terminal connected to second node in said input/output circuit whereby said multiplexer can select bit information in said memory cell in place of a signal from said first node to said second node to control operation of said input/output circuit.

135. The integrated circuit according to claim 134 wherein said multiplexer has a control terminal connected to a second memory cell whereby said multiplexer operates in response to bit information in said second memory cell.

136. The integrated circuit according to claim 134 wherein said first input terminal of said multiplexer is connected to an output terminal of a first logic gate having an input terminal connected to said first signal line, and said output terminal of said multiplexer connected to an input terminal of a second logic gate having an output terminal connected to said third signal line.

137. The integrated circuit according to claim 134 wherein said first input terminal of said multiplexer is connected to said fourth signal line, and said output terminal of said multiplexer connected to a control terminal of a second logic gate having an output terminal connected to said third signal line whereby said second logic gate is enabled or disabled responsive to a signal on said control terminal.

138. The integrated circuit according to claim 134 wherein said first input terminal of said multiplexer is connected to an output terminal of a first logic gate having an input terminal connected to said third signal line, and said output terminal of said multiplexer connected to said second signal line.

139. In an integrated circuit having a configurable circuit including an array of configurable units and a plurality of signal lines; and an array of memory cells and a plurality of conducting lines, one set of conducting lines generally aligned in a first direction and a second set of conducting lines generally aligned in a second direction perpendicular to said first direction, each memory cell connected to a node in said configurable circuit and no more than two of said conducting lines, one from each set of perpendicular conducting lines, by which bit information is communicated to and from said memory cell so that each memory cell capable of being randomly addressed by said two conducting lines, said memory cell holding electric charge representative of a single bit of information;

a method of operating said integrated circuit comprising directly placing each of said nodes in one logic state or another responsive to bits of information in said array of memory cells to define operation of said configurable circuit; and selectively addressing one memory cell in said memory cell array without addressing other memory cells in said array to define operation of said configurable circuit differently.

140. The method of operating an integrated circuit according to claim 139 comprising defining said node connected to said one memory cell as a control terminal of a switch connected between a pair of two signal lines, and said selective addressing step comprises turning said switch on to provide a conductive path between said two signal lines.

141. The method of operating an integrated circuit according to claim 139 comprising defining said node connected to said one memory cell as a gate of an MOS transistor, said MOS transistor having a pair of source/drains, each source/drain respectively connected to one of said signal lines, and said selective addressing step comprises turning said switch on to provide a conductive path between said two signal lines.

142. The method of operating an integrated circuit according to claim 139 comprising defining said node connected to said one memory cell as an input terminal of a buffer circuit having an output terminal connected to other parts of said configurable circuit, and said selective addressing step comprises setting a logic state into said configurable circuit responsive to the bit information stored by said one memory cell.

143. The method of operating an integrated circuit according to claim 142 comprising defining said buffer circuit output terminal so that a signal from said memory cell conditions a response of said configurable circuit with respect to signals over said signal lines to configure said configurable circuit.

144. The method of operating an integrated circuit according to claim 142 comprising defining said buffer circuit output terminal so that a signal from said memory cell sets a signal on said signal lines of said configurable circuit to control said configurable circuit.

145. The method of operating an integrated circuit according to claim 142 wherein said logic state is inverted with respect to the logic state representative by said bit information stored by said one memory cell.

146. The method of operating an integrated circuit according to claim 139 further comprising refreshing each memory cell in said memory array though said two conducting lines including reading the charge level of the memory cell and rewriting charge thereinto representative of its bit information.

147. The method of operating an integrated circuit according to claim 146 wherein said configurable circuit has a plurality of flip-flops, each flip-flop having a system clock input and at least one node connected to a memory cell for defining operation of a signal path between flip-flips responsive to the bit information of said memory cell; and generating a system clock to supply a system clock input to said flip-flops with respect to said refreshing step such that causes none of said flip-flops input wrong data on a system clock input.

148. The method of operating an integrated circuit according to claim 147 wherein said system clock generating step sets any system clock trigger event after the longest signal delay between flip-flops after a refresh of said memory cell.

149. The method of operating an integrated circuit according to claim 146 wherein said refreshing step comprises maintaining said bit information during a reading of said memory cell.

150. The method of operating an integrated circuit according to claim 139, further comprising monitoring bit information on at least one of said signal lines through a switch having a control terminal and first and second signal terminals, said first signal terminal connected to said one of said signal lines, said second signal terminal and said control terminal connected to two conducting lines respectively.

151. The method of operating an integrated circuit according to claim 150 wherein said switch comprises an MOS transistor.

152. The method of operating an integrated circuit according to claim 150 wherein at least one of said conducting lines is further connected to said array of memory cells.

153. The method of operating an integrated circuit according to claim 152 wherein both of said conducting lines are further connected to said array of memory cells.

154. In a configurable circuit, a method comprising storing state information in a memory cell;

periodically refreshing said memory cell by reading said state information from said memory cell and writing back said state information to said memory cell;

providing a dedicated electric connection between said memory cell and a node in said configurable circuit; and providing a defined state at said node corresponding to said state information in said memory cell.

155. The method of claim 154 wherein said electric connection providing step further comprises providing a switch for said node so as to selectively form electric connections between two line segments based on said state information stored in said memory cell; and interconnecting two configurable logic blocks using said two line segments.

156. The method of claim 154 wherein said electric connection providing step further comprises providing a buffer for said node so as to drive said state information in said memory cell onto said configurable circuit.

157. The method of claim 156 wherein said buffer providing step comprises providing a inverting buffer for said node so as to drive inverted state information onto said configurable circuit.

158. The method of claim 154 further comprising programming a circuit including flip-flops having a system clock input;

forming requests to refresh said state information in said memory cell;

forming requests to send said system clock input to said flip-flops; and arbitrating between said requests to refresh said state information and said requests to input said system clock to said flip-flops.

159. The method of claim 154 further comprising maintaining said state information in said memory cell during said refreshing step.

* * * * *